United States Patent
Mikasa

(10) Patent No.: US 8,390,064 B2
(45) Date of Patent: Mar. 5, 2013

(54) SEMICONDUCTOR DEVICE HAVING GATE TRENCHES AND MANUFACTURING METHOD THEREOF

(75) Inventor: Noriaki Mikasa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 728 days.

(21) Appl. No.: 12/635,309

(22) Filed: Dec. 10, 2009

(65) Prior Publication Data

US 2010/0148248 A1    Jun. 17, 2010

(30) Foreign Application Priority Data

Dec. 11, 2008   (JP) ................................. 2008-315679

(51) Int. Cl.
*H01L 29/78* (2006.01)
(52) U.S. Cl. ................. 257/337; 257/E21.421; 438/296
(58) Field of Classification Search .................. 257/334, 257/E21.421, E29.264; 438/270, 296
See application file for complete search history.

(56) References Cited

U.S. PATENT DOCUMENTS

| | | | |
|---|---|---|---|
| 7,232,727 B2 | 6/2007 | Park | |
| 7,381,612 B2 | 6/2008 | Suh | |
| 2006/0134858 A1 | 6/2006 | Yamazaki | |
| 2007/0018239 A1* | 1/2007 | Chen et al. | 257/329 |
| 2007/0052037 A1* | 3/2007 | Luan | 257/369 |

FOREIGN PATENT DOCUMENTS

| | | |
|---|---|---|
| JP | 2005-322880 A | 11/2005 |
| JP | 2006-173429 A | 6/2006 |
| JP | 2006-261627 A | 9/2006 |

* cited by examiner

*Primary Examiner* — Roy Potter
(74) *Attorney, Agent, or Firm* — Sughrue Mion, PLLC

(57) ABSTRACT

A semiconductor device includes a first gate trench, a second gate trench, and a dummy gate trench provided in an active region extending in an X direction; and a first gate electrode, a second gate electrode, and a dummy gate electrode extending in a Y direction crossing the active region, at least a part of which are buried in the first gate trench, the second gate trench, and the dummy gate trench, respectively. The dummy gate electrode arranged between second and third diffusion layers isolates and separates a transistor constituted by the first gate electrode and first and second diffusion layers provided on both sides of the first gate electrode, respectively, from a transistor constituted by the second gate electrode and third and fourth diffusion layers provided on both sides of the second gate electrode, respectively.

11 Claims, 27 Drawing Sheets

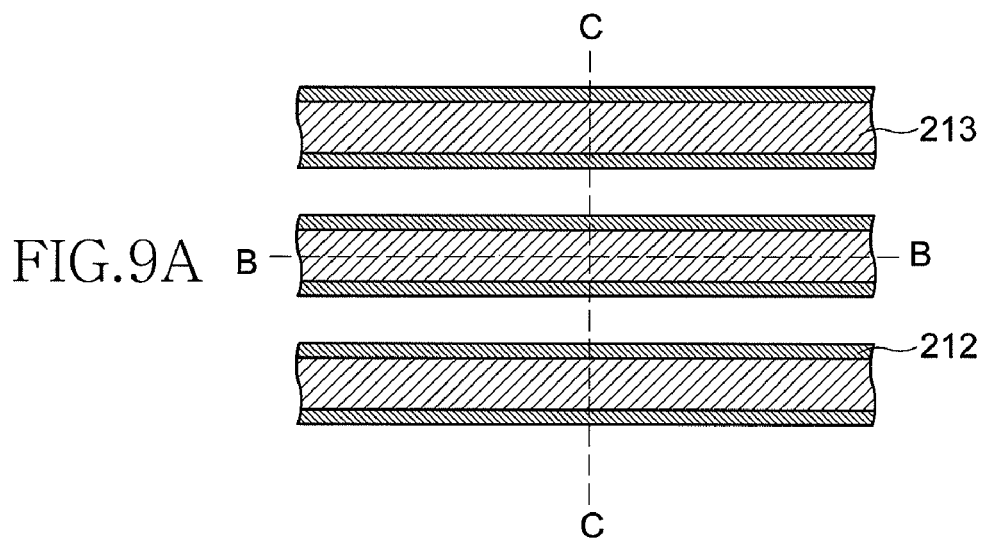

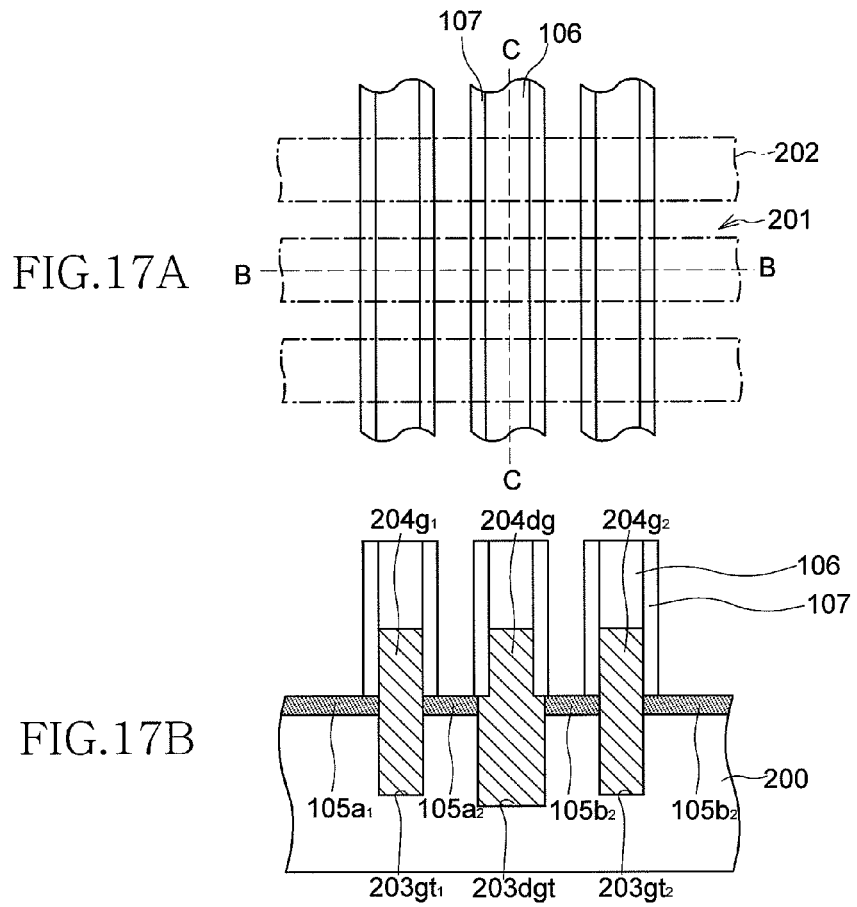
FIG.17A
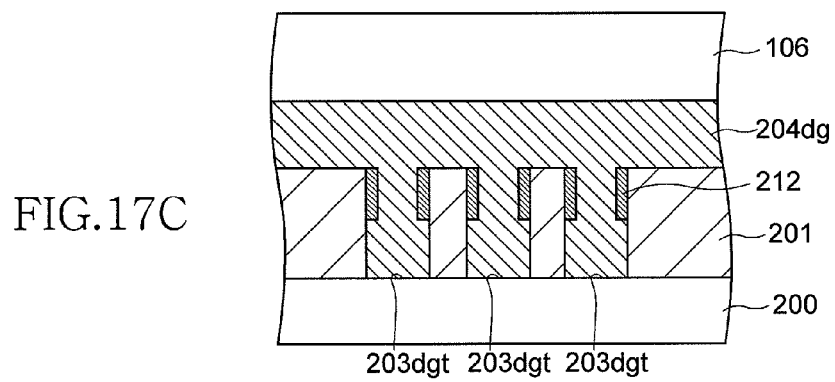
FIG.17B
FIG.17C
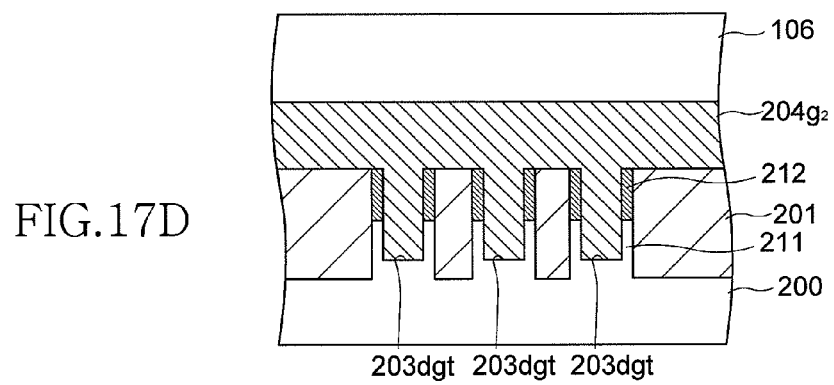
FIG.17D

SEMICONDUCTOR DEVICE HAVING GATE TRENCHES AND MANUFACTURING METHOD THEREOF

BACKGROUND OF THE INVENTION

1. Field of the Invention

The present invention relates to a semiconductor device and a manufacturing method thereof, and more particularly relates to a semiconductor device including trench gate transistors (trench gate is also referred to as "recess channel", see Japanese Patent Application Laid-open Nos. 2005-322880, 2006-173429, and 2006-261627) and a manufacturing method of the semiconductor device.

2. Description of Related Art

Generally, in a manufacturing method of a semiconductor device, fine patterns are formed by photolithography and dry etching.

FIGS. 26A and 26B show a configuration of memory cell transistors of an ordinary DRAM, where FIG. 26A is a schematic plan view and FIG. 26B is a schematic cross-sectional view taken along a line B-B of FIG. 26A.

As shown in FIGS. 26A and 26B, STI (Shallow Trench Isolation) regions 401 are formed in a semiconductor substrate 400 by photolithography and dry etching, thereby defining and dividing active regions 402. Gate electrodes 403 each having an upper surface covered with a cap insulating film 405 and a side surface covered with a sidewall insulating film 406 are provided to cross the active regions 402. Contact plugs 407 are formed on diffusion layers 404 provided on both sides of each gate electrode 403 so as to be connected to the diffusion layers 404, respectively. In the example shown in FIGS. 26A and 26B, the active regions 402 are formed to be sufficiently wide on both sides of the gate electrodes 403. Due to this, the diffusion layers 404 are also formed to be sufficiently large. This arrangement enables each contact plug 407 and the diffusion layer 404 corresponding to the contact plug 407 to be connected to each other by as much as a sufficient area, thus suppressing contact resistance to be low.

However, along with downscaling of semiconductor devices, it has been difficult to form fine patterns by photolithography and dry etching. For example, the following problems occur when the active regions surrounded by the STI regions in a region where memory cells are formed to have minimum working dimensions such as a memory cell region of a DRAM.

FIGS. 27A and 27B show a configuration of memory cell transistors when the distance between two adjacent active regions is narrower, where FIG. 27A is a schematic plan view and FIG. 27B is a schematic cross-sectional view taken along a line B-B of FIG. 27A. In FIGS. 27A and 27B, constituent elements identical to those in FIGS. 26A and 26B are denoted by like reference numerals and explanations thereof will be omitted.

In FIGS. 27A and 27B, the distance between two adjacent active regions 502 is made narrower, and thus photolithography and dry etching are not performed satisfactorily, so that an area of each of the active regions 502 defined and divided by STI regions 501 is reduced. This reduces areas of the diffusion layers 504. As indicated by a dotted line in FIG. 27A, a contact area by which one contact plug 407 contacts with the diffusion layer 504 corresponding to the contact plug 407 is considerably reduced. Accordingly, there occurs a problem that contact resistance considerably increases.

While problems of conventional techniques have been described while referring to a memory cell region of a DRAM by way of example, these problems similarly and possibly occur to peripheral regions of a DRAM and in formation of fine patterns in other semiconductor devices.

SUMMARY

The present invention seeks to solve one or more of the above problems, or to improve upon those problems at least in part.

In one embodiment, there is provided a semiconductor device comprising: an active region provided in a semiconductor substrate, defined by an STI region, and extending in a first direction; a first gate trench, a second gate trench, and a dummy gate trench formed in the active region; a first gate electrode, a second gate electrode, and a dummy gate electrode extending in a second direction crossing the first direction, at least a part of the first gate electrode, the second gate electrode, and the dummy gate electrode being buried in the first gate trench, the second gate trench, and the dummy gate trench, respectively; first and second diffusion layers formed in the active region provided on both sides of the first gate electrode, respectively; and third and fourth diffusion layers formed in the active region provided on both sides of the second gate electrode, respectively, wherein the first gate electrode and the first and second diffusion layers constitute a first transistor, the second gate electrode and the third and fourth diffusion layers constitute a second transistor, and the dummy gate electrode is arranged between the second diffusion layer and the third diffusion layer, and electrically isolates the first transistor from the second transistor.

In another embodiment, there is provided a method of manufacturing a semiconductor device comprising: forming STI trenches in a semiconductor substrate to define an active region extending in a first direction in the semiconductor substrate; burying the STI trenches with an insulating film; forming a first gate trench, a second gate trench, and a dummy gate trench in the active region; forming a first gate electrode, a second gate electrode, and a dummy gate electrode extending in a second direction crossing the first direction so that at least a part of the first gate electrode, the second gate electrode, and the dummy gate electrode are buried in the first gate trench, the second gate trench, and the dummy gate trench, respectively; and forming first and second diffusion layers in the active region on both sides of the first gate electrode, respectively so as to form a first transistor constituted by the first gate electrode and the first and second diffusion layers, and forming third and fourth diffusion layers in the active region on both sides of the second gate electrode, respectively so as to form a second transistor constituted by the second gate electrode and the third and fourth diffusion layers, wherein the dummy gate electrode is arranged between the second diffusion layer and the third diffusion layer, and electrically isolates the first transistor from the second transistor.

According to the present invention, the STI region does not isolate and separate the first transistor from the second transistor. Instead, the dummy gate trench is provided in the active region where the first and second gate electrodes are formed, the dummy gate electrode is formed in the dummy gate trench, and the dummy gate electrode is arranged between the diffusion layer of the first transistor and the diffusion layer of the second transistor. The dummy gate electrode thereby functions as an element isolation region. Therefore, photolithographic and dry etching targets can be limited to line-and-space patterns extending in the first direction. The line-and-space patterns are relatively easy to resolve by the photolithography. Therefore, it is possible to prevent reduction in active region patterns in the first direction. Accordingly, it is possible to suppress reduction in areas of the diffusion layers and suppress a contact area between the contact plug and one diffusion layer from being reduced. This can suppress contact resistance to be sufficiently low.

BRIEF DESCRIPTION OF THE DRAWINGS

The above features and advantages of the present invention will be more apparent from the following description of certain preferred embodiments taken in conjunction with the accompanying drawings, in which:

FIG. 1A is a schematic plan view, FIG. 1B is a schematic cross-sectional view taken along a line B-B of FIG. 1A, and FIG. 1C is a schematic cross-sectional view taken along a line C-C of FIG. 1A;

FIG. 7A is a schematic plan view, FIG. 7B is a schematic cross-sectional view taken along a line B-B of FIG. 7A, FIG. 7C is a schematic cross-sectional view taken along a line C-C of FIG. 7A, and FIG. 7D is a schematic cross-sectional view taken along a line D-D of FIG. 7A;

FIGS. 9A to 9C show one step (forming sidewall insulating films 212) of manufacturing processes of the semiconductor device 20 according to the second embodiment;

FIGS. 17A to 17D show one step (forming a first gate electrode 204$g_1$, a second gate electrode 204$g_2$ and a dummy gate electrode 204$dg$) of manufacturing processes of the semiconductor device 20 according to the second embodiment;

FIG. 18A is a schematic plan view, FIG. 18B is a schematic cross-sectional view taken along a line B-B of FIG. 18A, FIG. 18C is a schematic cross-sectional view taken along a line C-C of FIG. 18A, and FIG. 18D is a schematic cross-sectional view taken along a line D-D of FIG. 18A;

FIG. 26A is a schematic plan view and FIG. 26B is a schematic cross-sectional view taken along a line B-B of FIG. 26A; FIG. 27A is a schematic plan view and FIG. 27B is a schematic cross-sectional view taken along a line B-B of FIG. 27A.

DETAILED DESCRIPTION OF THE EMBODIMENTS

Preferred embodiments of the present invention will be explained below in detail with reference to the accompanying drawings.

Figure 1A:
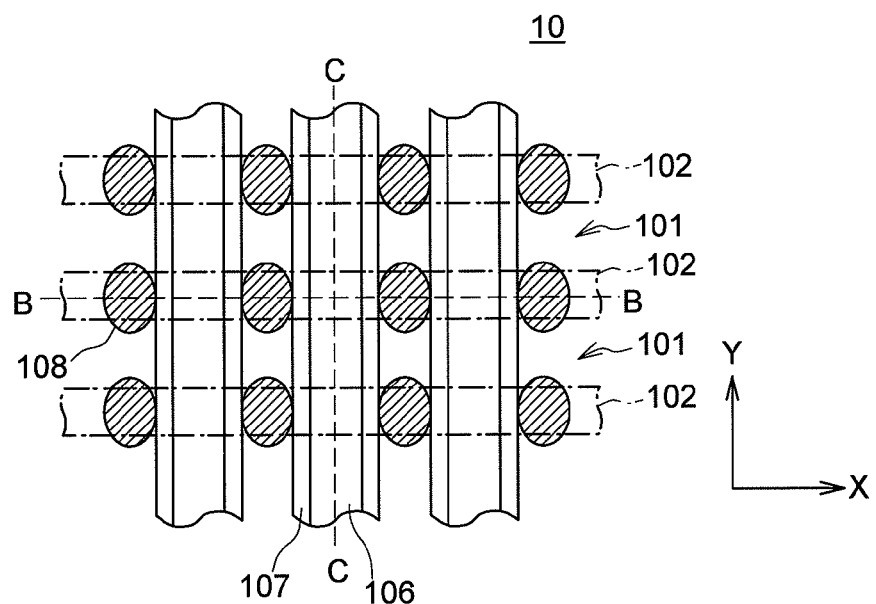
FIGS. 1A to 1C show a configuration of a semiconductor device 10 according to a first embodiment of the present invention, where
Figure 1B:
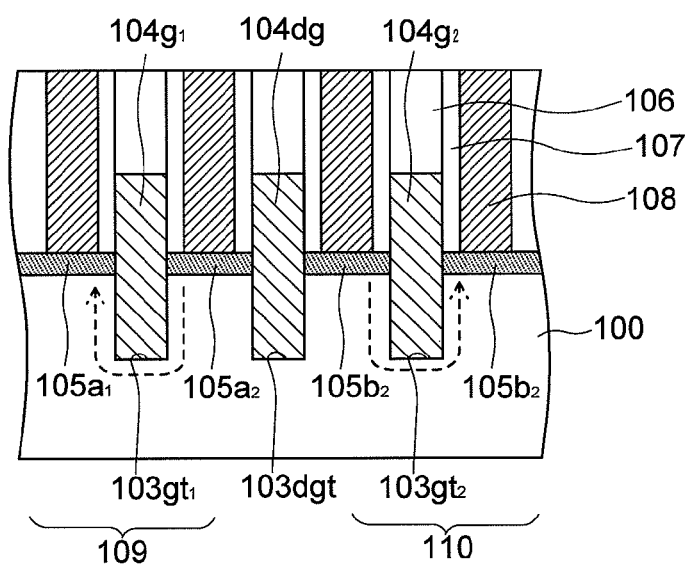
Figure 1C:
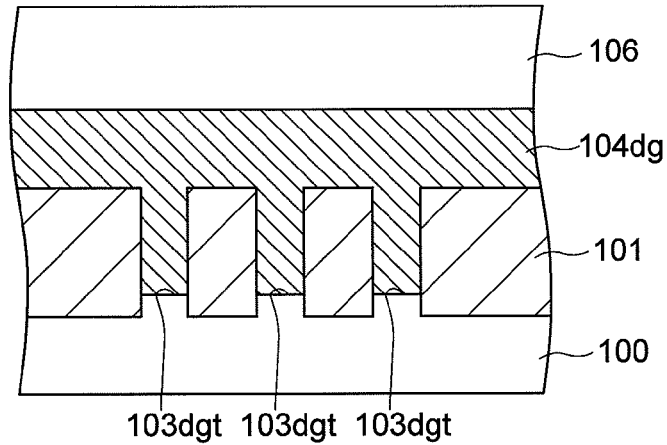

FIGS. 1A to 1C show a configuration of a semiconductor device 10 according to a first embodiment of the present invention, where FIG. 1A is a schematic plan view, FIG. 1B is a schematic cross-sectional view taken along a line B-B of FIG. 1A, and FIG. 1C is a schematic cross-sectional view taken along a line C-C of FIG. 1A. The semiconductor device 10 according to the first embodiment is a DRAM, and FIGS. 1A to 1C show the configuration at a time when formation of contact plugs to be connected to diffusion layers is completed.

As shown in FIGS. 1A to 1C, the semiconductor device 10 according to the first embodiment is configured to include active regions 102 provided in a semiconductor substrate 100, defined and divided by STI regions 101, and extending in an X direction (a first direction), first gate trenches $103gt_1$, second gate trenches $103gt_2$, and dummy gate trenches $103dgt$ provided in the active regions 102, and first gate electrodes $104g_1$, second gate electrodes $104g_2$, and dummy gate electrodes $104dg$ which extend in a Y direction (second direction) crossing the active regions 102, and at least a part of which are buried in the first gate trenches $103gt_1$, second gate trenches $103gt_2$, and dummy gate trenches $103dgt$, respectively. Each of the dummy gate electrodes $104dg$ is arranged between one first gate electrode $104g_1$ and one second gate electrode $104g_2$.

First to fourth diffusion layers $105a_1$, $105a_2$, $105b_1$, and $105b_2$ to serve as source/drain regions are provided on both sides of the first and second gate electrodes $104g_1$ and $104g_2$, respectively. A cap insulating film 106 is provided on each of upper surfaces of the first and second gate electrodes $104g_1$ and $104g_2$ and the dummy gate electrodes $104dg$, and a sidewall insulating film 107 is provided on each of both side surfaces thereof. Contact plugs 108 are connected to $105a_2$, $105b_1$, and $105b_2$, respectively, thereby electrically connecting bit contacts or capacity contacts (not shown) to be provided on higher layers than the diffusion layers $105a_1$, $105a_2$, $105b_1$, and $105b_2$ to the diffusion layers.

One first gate electrode $104g_1$ and the first and second diffusion layers $105a_1$ and $105a_2$ constitute a first transistor 109, and one second gate electrode $104g_2$ and the third and fourth diffusion layers $105b_1$ and $105b_2$ constitute a second transistor 110. A predetermined bias is applied to each of the first and second gate electrodes $104g_1$ and $104g_2$ to thereby perform a transistor operation so as to form channels opposite in conduction type to the semiconductor substrate 100 as indicated by a broken-line arrow shown in FIG. 1B.

Meanwhile, each dummy gate electrode $104dg$ is arranged between the second diffusion layer $105a_2$ and the third diffusion layer $105b_1$, whereby the dummy gate electrode $104dg$ and the second and third diffusion layers $105a_2$ and $105b_1$ constitute a transistor. However, a bias opposite to the predetermined bias is always applied to the dummy gate electrode $104dg$, so that no channel is formed between the diffusion layers $105a_2$ and $105b_1$. That is, the transistor constituted by the dummy gate electrode $104dg$ and the second and third diffusion layers $105a_2$ and $105b_1$ is always turned off. Therefore, the dummy gate electrode $104gd$ functions as an element isolation region that isolates and separates the first transistor 109 from the second transistor 110.

A manufacturing method of the semiconductor device 10 according to the first embodiment is explained next.

FIGS. 2A to 2C to FIGS. 6A to 6C show manufacturing processes of the manufacturing method of the semiconductor device 10 according to the first embodiment. In FIGS. 2A to 2C to FIGS. 6A to 6C, each drawing tagged as "A" is a schematic plan view, each drawing tagged as "B" is a schematic cross-sectional view taken along a line B-B of "A", and each drawing tagged as "C" is a schematic cross-sectional view taken along a line C-C of "A".

Figure 2A:
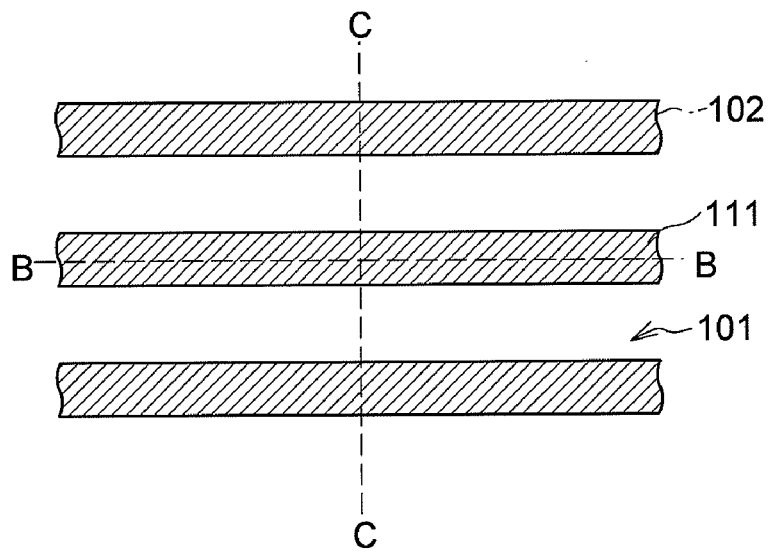
FIGS. 2A to 2C show one step (forming a first mask layer 111) of manufacturing processes of the semiconductor device 10 according to the first embodiment.
Figure 2B:
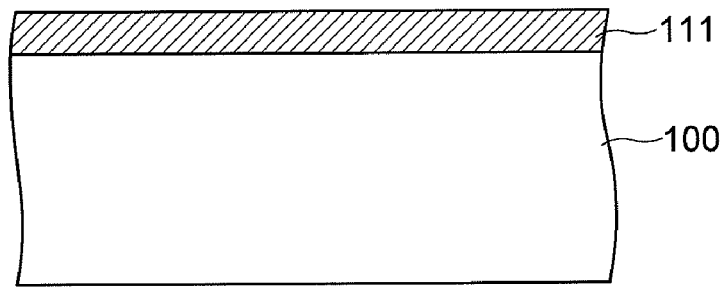
Figure 2C:
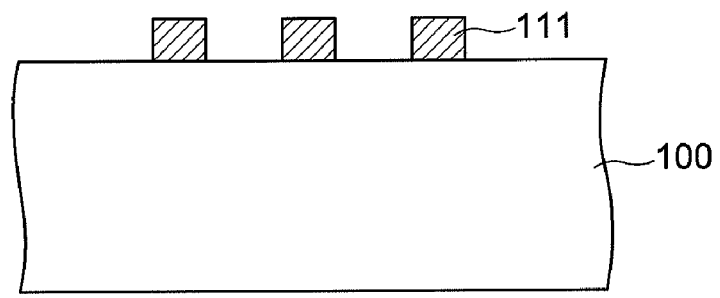
Figure 3A:
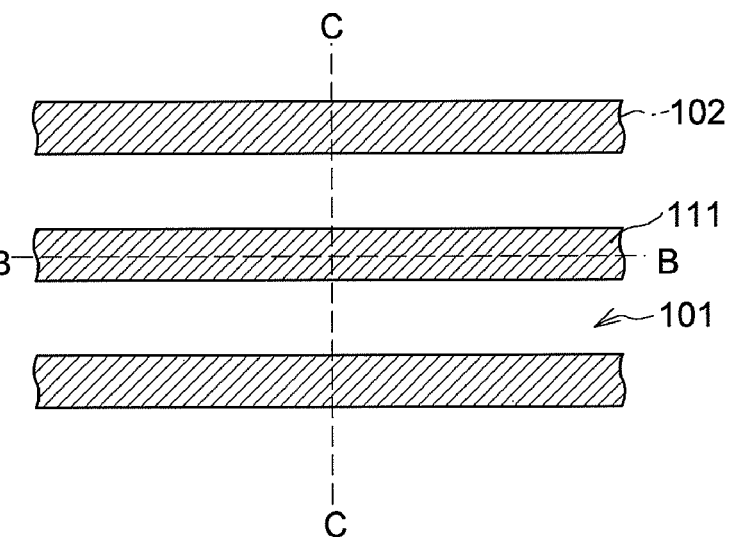
FIGS. 3A to 3C show one step (forming STI regions 101) of manufacturing processes of the semiconductor device 10 according to the first embodiment.
Figure 3B:
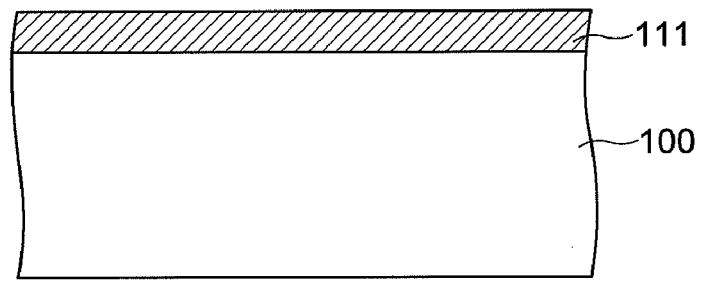
Figure 3C:
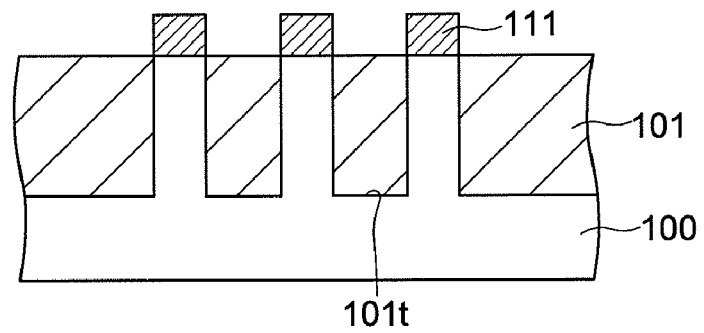

First, as shown in FIGS. 2A to 2C, a first mask layer 111 having line-and-space patterns is formed on the semiconductor substrate 100 so as to cover regions that are to serve as the active regions 102. As shown in FIGS. 3A to 3C, the semiconductor substrate 100 is etched by using the mask layer 111 to thereby form STI trenches $101t$. Thereafter, the STI trenches $101t$ are buried with an insulating film, thereby forming the STI regions 101.

Figure 4A:
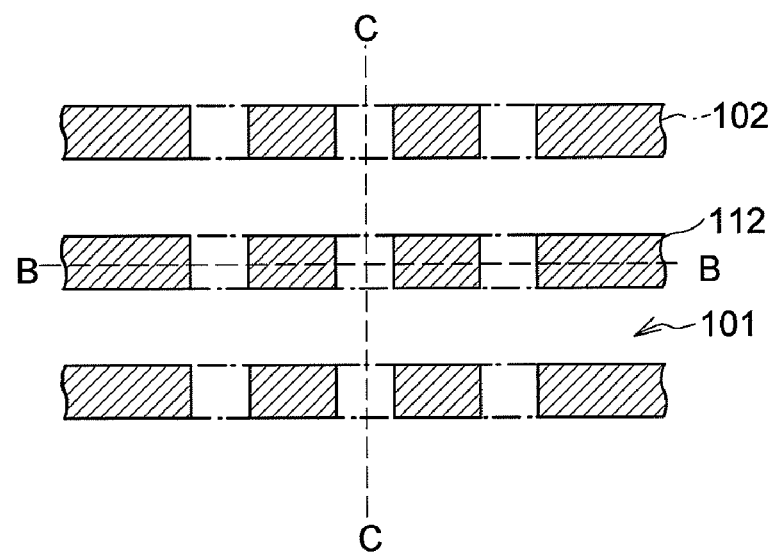
FIGS. 4A to 4C show one step (forming a second mask layer 112) of manufacturing processes of the semiconductor device 10 according to the first embodiment.
Figure 4B:
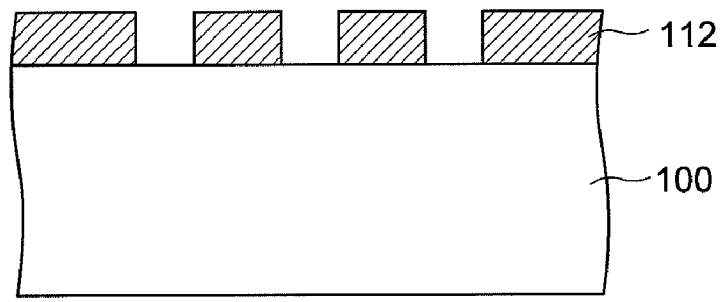
Figure 4C:
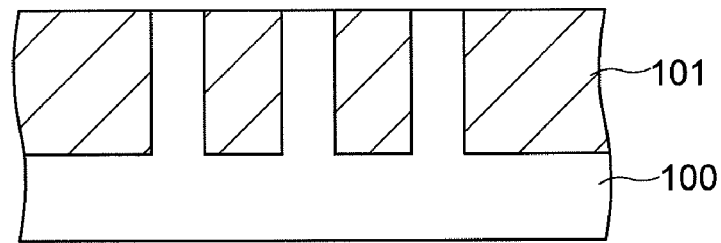
Figure 5A:
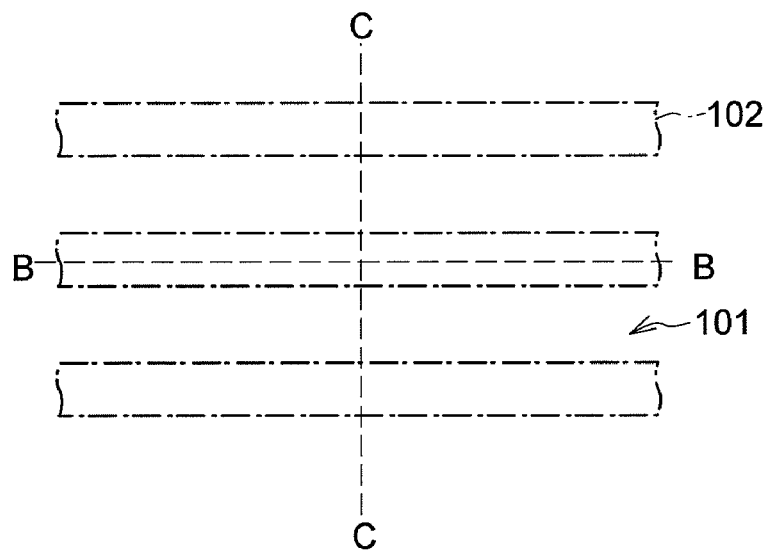
FIGS. 5A to 5C show one step (forming a first gate trench 103$gt_1$, a second gate trench 103$gt_2$ and a dummy gate trench 103$dgt$) of manufacturing processes of the semiconductor device 10 according to the first embodiment.
Figure 5B:
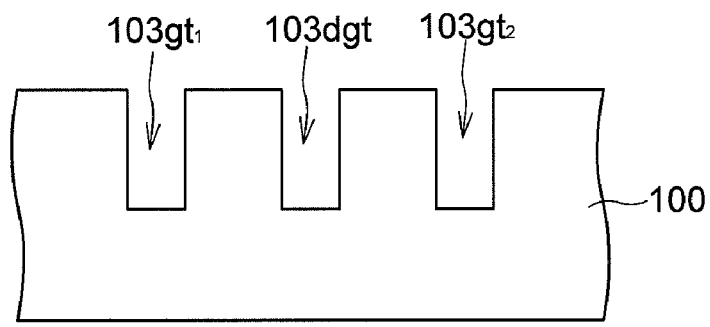
Figure 5C:
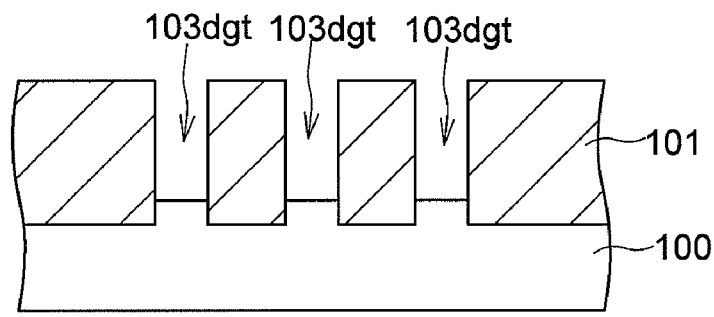

After removing the first mask layer 111, a second mask layer 112 exposing regions, where the first gate trenches $103gt_1$, the second gate trenches $103gt_2$, and the dummy gate trenches $103dgt$ are formed, is formed on the active regions 102 of the semiconductor substrate 100, as shown in FIGS. 4A to 4C. By using the second mask layer 112, the semiconductor substrate 100 is etched, thereby forming the first gate trenches $103gt_1$, the second gate trenches $103gt_2$, and the dummy gate trenches $103dgt$ as shown in FIGS. 5A to 5C.

Figure 6A:
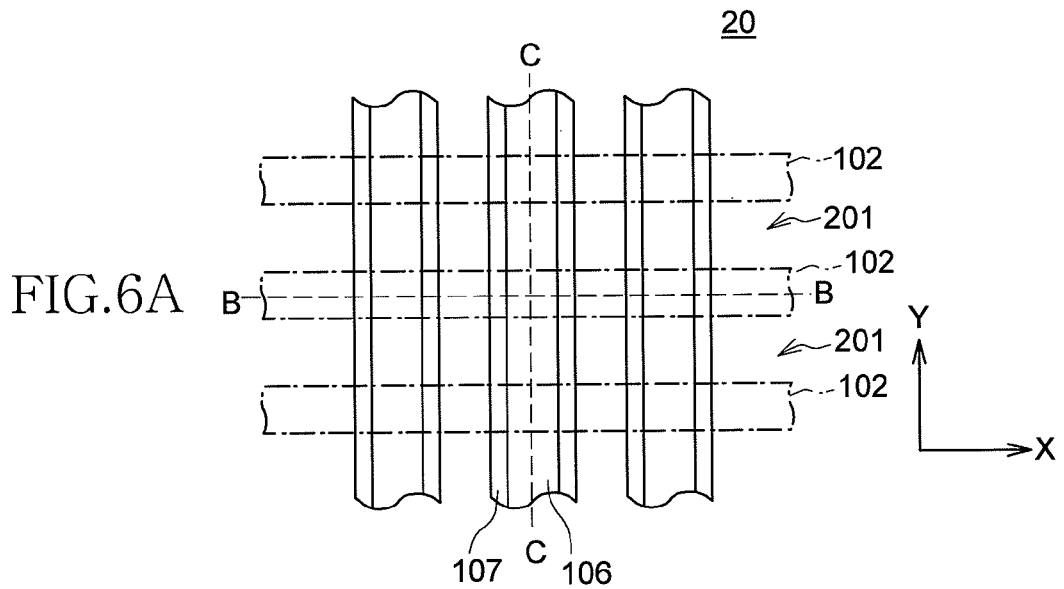
FIGS. 6A to 6C show one step (forming a first gate electrode 104$g_1$, a second gate electrode 104$g_2$ and a dummy gate electrode 104$dg$) of manufacturing processes of the semiconductor device 10 according to the first embodiment.
Figure 6B:
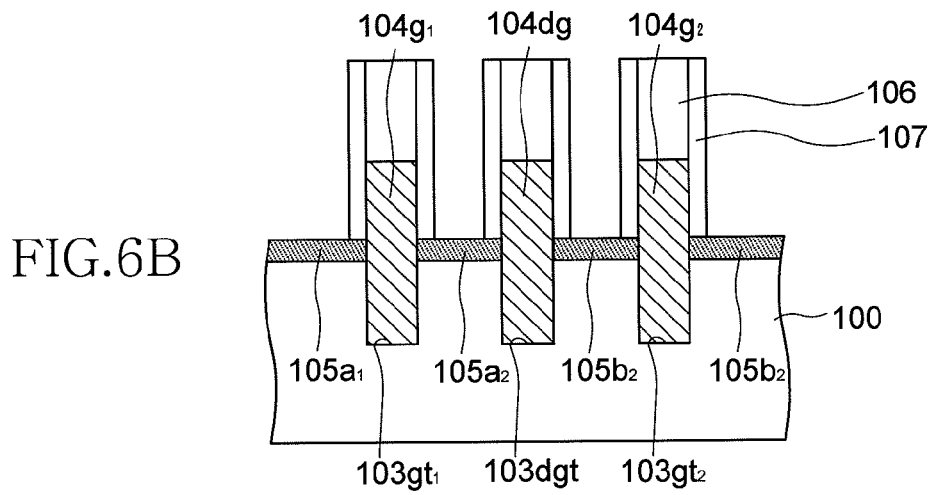
Figure 6C:
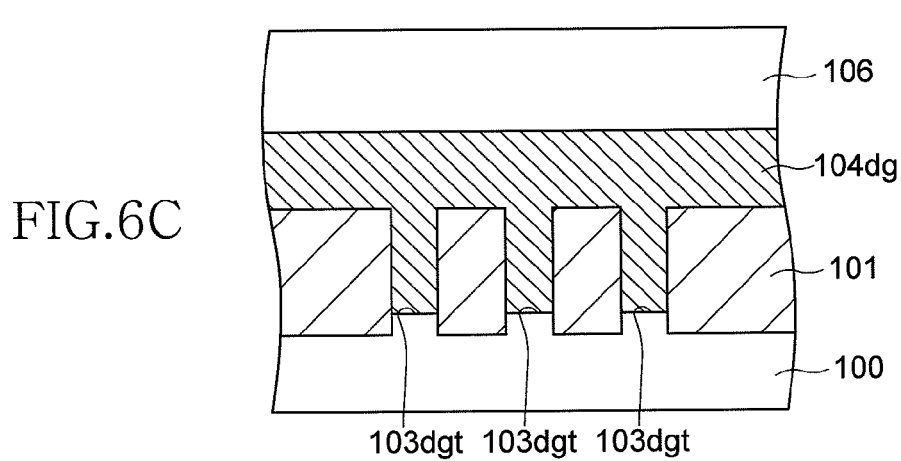

A conductive material is then formed on an entire surface to bury the first gate trenches $103gt_1$, the second gate trenches $103gt_2$, and the dummy gate trenches $103dgt$ with the conductive material. Thereafter, as shown in FIGS. 6A to 6C, the cap insulating films 106 are formed and the conductive material is patterned by using the cap insulating films 106 as a mask. The first gate electrodes $104gt_1$, the second gate electrodes $104gt_2$, and the dummy gate electrodes $104dgt$ at least a part of which are buried in the first gate trenches $103gt_1$, the second gate trenches $103gt_2$, and the dummy gate trenches $103dgt$, respectively are thereby formed.

By using the first and second gate electrodes $104g_1$ and $104g_2$, the dummy gate electrodes $104dg$, and the cap insulating films 106 as a mask, impurity ions are implanted into the semiconductor substrate 100, thereby forming the first to fourth diffusion layers $105a_1$, $105a_2$, $105b_1$, and $105b_2$. Next, the sidewall insulating films 107 are formed on side surfaces of the first and second gate electrodes $104g_1$ and $104g_2$, the dummy gate electrodes $104dg$, and the cap insulating films 106, respectively. The contact plugs 108 connected to the diffusion layers $105a_1$, $105a_2$, $105b_2$, and $105b_3$, respectively are formed, thereby obtaining the configuration shown in FIGS. 1A to 1C.

As described above, according to the first embodiment, the STI regions 101 are responsible for element isolation in the Y direction (see FIGS. 1A to 1C) and the dummy gate electrodes $104dg$ are responsible for element isolation in the X direction. Therefore, patterns of the active regions 102 can be formed as line-and-space patterns capable of ensuring photolithographically high resolution and extending in one direction (X direction), and thus it is possible to prevent reduction in the active regions 102. It is thereby possible to reduce areas of the diffusion layers $105a_1$, $105a_2$, $105b_2$, and $105b_3$, sufficiently secure contact areas by which the contact plugs 108 contact with the diffusion layers $105a_1$, $105a_2$, $105b_2$, and $105b_3$, respectively, and suppress contact resistance to be low.

A second embodiment of the present invention is described next. In the second embodiment, a transistor having a so-called double-fin structure in which fin portions formed by a part of a semiconductor substrate and constituting channel regions are provided on side surfaces of gate trenches, respectively is used as a memory cell transistor. Furthermore, in the second embodiment, no fin portions are provided on side surfaces of dummy gate trenches functioning as element isolation regions.

Figure 7A:
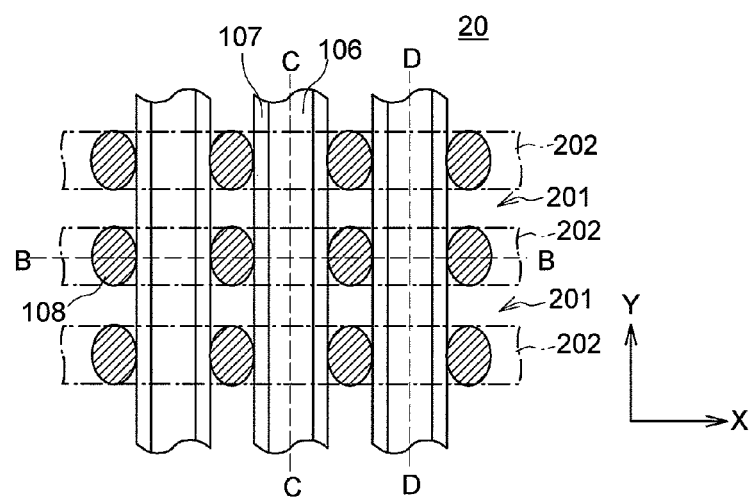
FIGS. 7A to 7D show a configuration of a semiconductor device 20 according to a second embodiment of the present invention, where
Figure 7B:
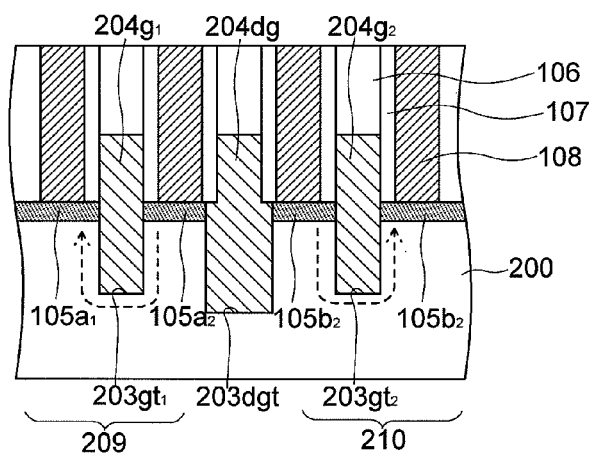
Figure 7C:
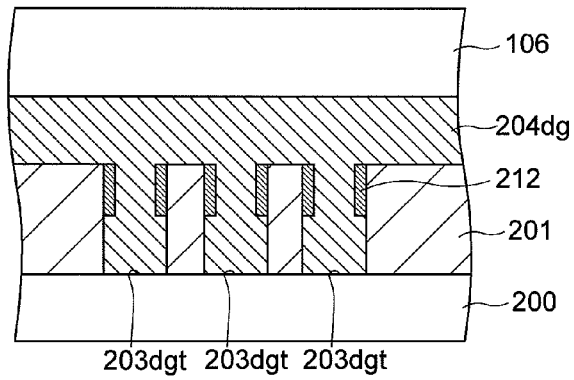
Figure 7D:
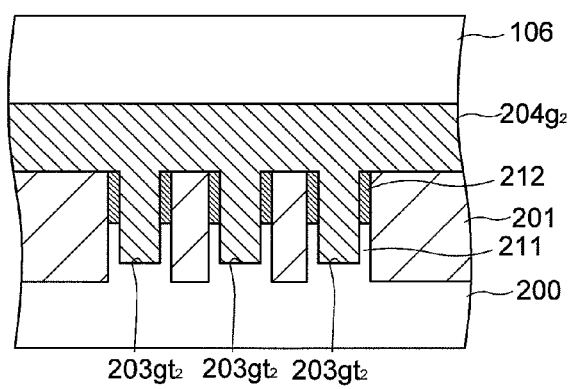

FIGS. 7A to 7D show a configuration of a semiconductor device 20 according to the second embodiment, where FIG. 7A is a schematic plan view, FIG. 7B is a schematic cross-sectional view taken along a line B-B of FIG. 7A, FIG. 7C is a schematic cross-sectional view taken along a line C-C of FIG. 7A, and FIG. 7D is a schematic cross-sectional view taken along a line D-D of FIG. 7A. In the second embodiment, constituent elements identical to those in the semiconductor device 10 according to the first embodiment are denoted by like reference numerals and explanations thereof will be omitted.

As shown in FIG. 7D, the semiconductor device 20 according to the second embodiment includes fin portions 211 provided in lower portions of side surfaces of first and second gate trenches $203gt_1$ and $203gt_2$ in an X direction, formed by a part of a semiconductor substrate 200, and constituting a part of channel regions, respectively. Regions defined and divided by STI regions 201 and each indicated by a one-dot chain line are active regions 202. In a first transistor 209 and a second transistor 210, channel regions formed when a predetermined bias is applied to each of first and second gate electrodes $204gt_1$ and $204gt_2$ are formed not only on side surfaces and bottom surfaces of the first and second gate trenches $203gt_1$ and $203gt_2$ in a Y direction but also on the fin portions 211 provided on the side surfaces thereof in the X direction. By this arrangement, it is possible to reduce threshold voltages of the first and second transistors 209 and 210. Meanwhile, as shown in FIG. 7C, no fin portions are formed on side surfaces of dummy gate trenches 203dgt in the X direction. That is, the side surfaces of dummy gate trenches 203dgt in the X direction contact with the STI regions 201 without via a part of the semiconductor substrate 200. By this arrangement, a threshold voltage of a transistor including each dummy gate electrode 204dg can be set higher than those of the first and second transistors 209 and 210. It is, therefore, possible to ensure that each dummy gate electrode 204dg functions as an element isolation region between the first and second transistors 209 and 210.

Sidewall insulating films 212 are provided on upper portions of the side surfaces of the first and second gate trenches $203gt_1$ and $203gt_2$ in the X direction, respectively. Therefore, the upper portions of the first and second gate trenches $203gt_1$ and $203gt_2$ contact with the STI regions 201 via the sidewall insulating films 212. Although the fin portions 211 can be formed to be high enough to reach above the upper portions of the first and second gate trenches $203gt_1$ and $203gt_2$, such fin portions 211 tend to cause a problem that it is difficult to control threshold voltages. For this reason, the fin portions 211 are formed as shown in FIG. 7D.

A manufacturing method of the semiconductor device 20 according to the second embodiment is described next.

FIGS. 8A to 8C to FIGS. 17A to 17D show manufacturing processes of the manufacturing method of the semiconductor device 20 according to the second embodiment. In FIGS. 8A to 8C to FIGS. 17A to 17D, each drawing tagged as "A" is a schematic plan view, each drawing tagged as "B" is a schematic cross-sectional view taken along a line B-B of "A", each drawing tagged as "C" is a schematic cross-sectional view taken along a line C-C of "A", and each drawing tagged as "D" is a schematic cross-sectional view taken along a line D-D of "A". When the schematic cross-sectional view taken along the line D-D is identical to that taken along the line C-C, the drawing tagged as "D" will be omitted.

Figure 8A:
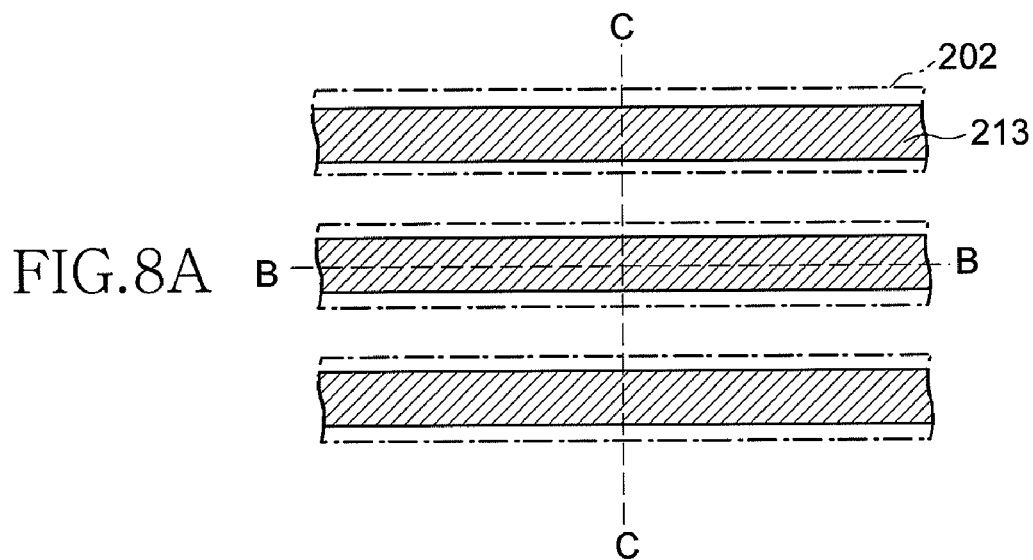
FIGS. 8A to 8C show one step (forming a first mask layer 213) of manufacturing processes of the semiconductor device 20 according to the second embodiment.
Figure 8B:
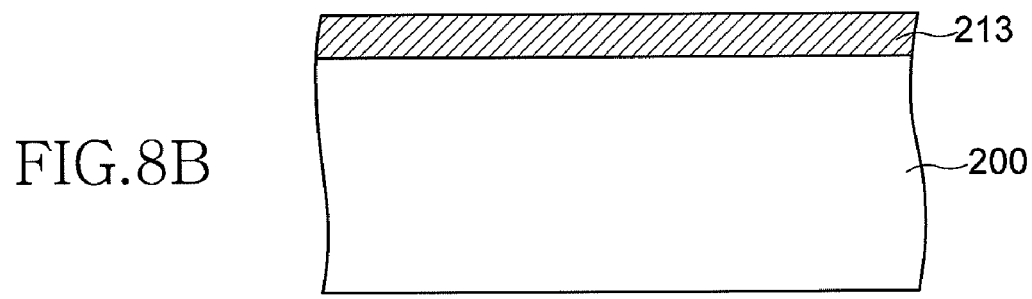
Figure 8C:
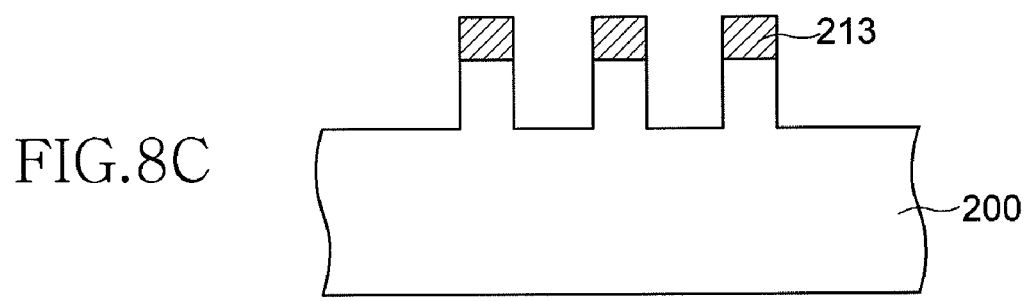

First, as shown in FIGS. 8A to 8C, a first mask layer 213 having line-and-space patterns is formed on the semiconductor substrate 200. The region indicated by a one-dot chain line is to serve as the active region 202 later. In the second embodiment, the first mask layer 213 is formed to be narrower than the active region 202. By using the first mask layer 213, as a mask, the semiconductor substrate 200 is etched to thereby form trenches.

Figure 10A:
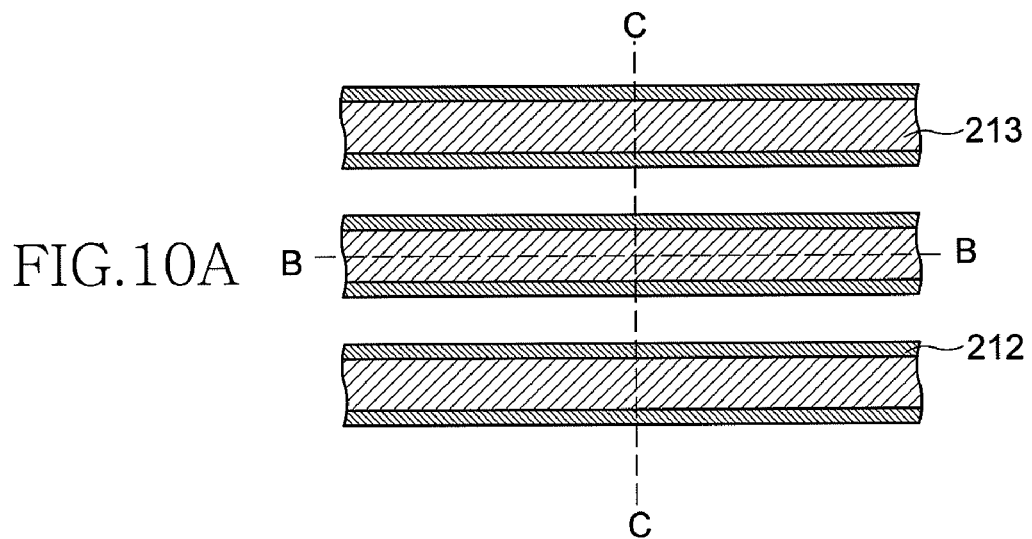
FIGS. 10A to 10C show one step (forming STI trenches 201$t$) of manufacturing processes of the semiconductor device 20 according to the second embodiment.
Figure 10B:
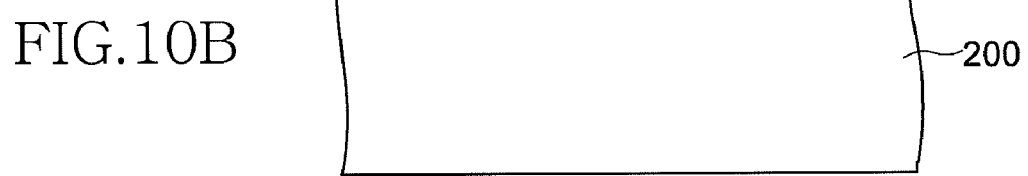
Figure 10C:
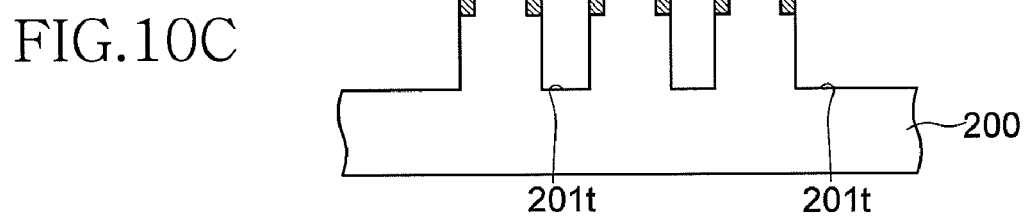

As shown in FIGS. 9A to 9C, an insulating film is formed on an entire surface and the insulating film is then etched back, thereby forming sidewall insulating films 212 on side surfaces of the first mask layer 213, respectively. As shown in FIGS. 10A to 10C, by using the first mask layer 213 and the sidewall insulating films 212 as a mask, the semiconductor substrate 200 is etched to make the trenches deeper, thereby forming STI trenches 201t.

Figure 11A:
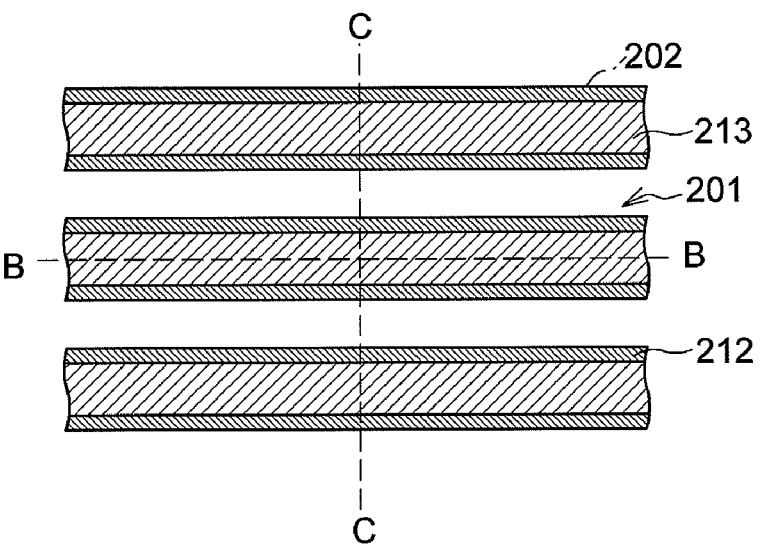
FIGS. 11A to 11C show one step (forming STI regions 201) of manufacturing processes of the semiconductor device 20 according to the second embodiment.
Figure 11B:
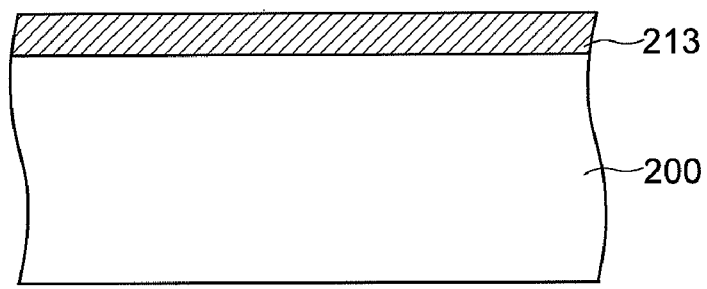
Figure 11C:
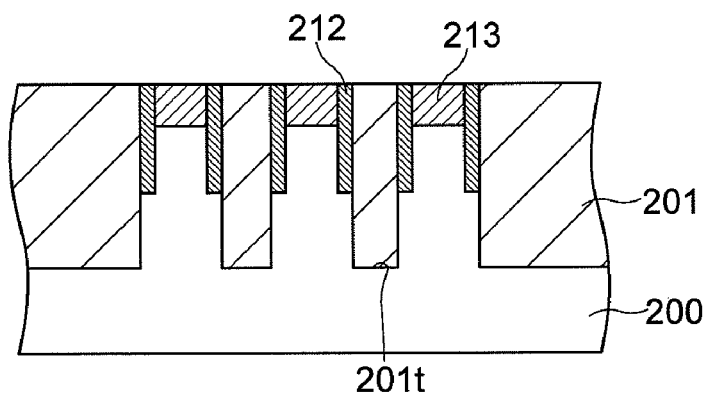

As shown in FIGS. 11A to 11C, the STI trenches 201t are buried with an insulating film, thereby forming the STI regions 201. In this way, the STI regions 201 define and divide the active regions 202.

Figure 12A:
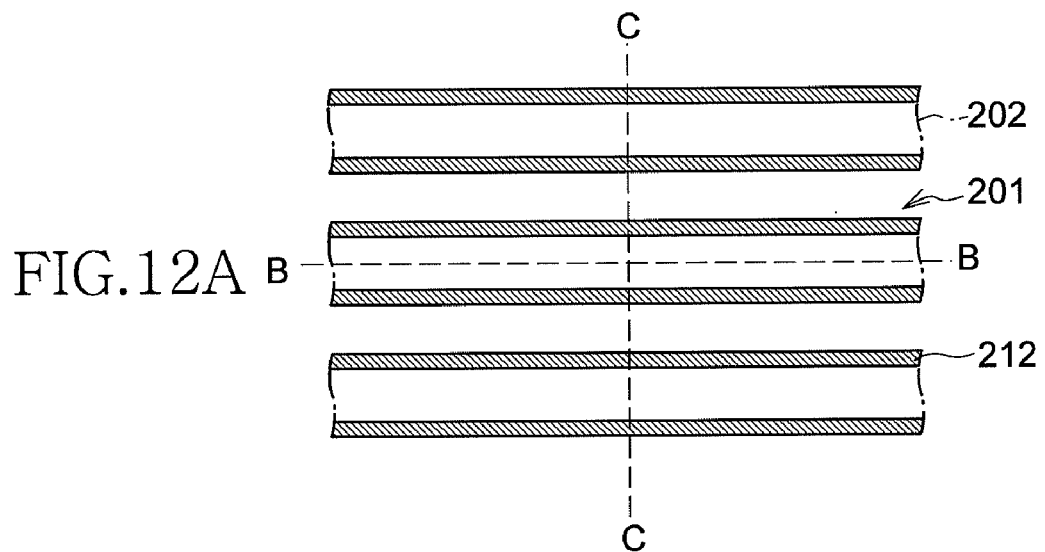
FIGS. 12A to 12C show one step (removing the first mask layer 213) of manufacturing processes of the semiconductor device 20 according to the second embodiment.
Figure 12B:
Figure 12C:
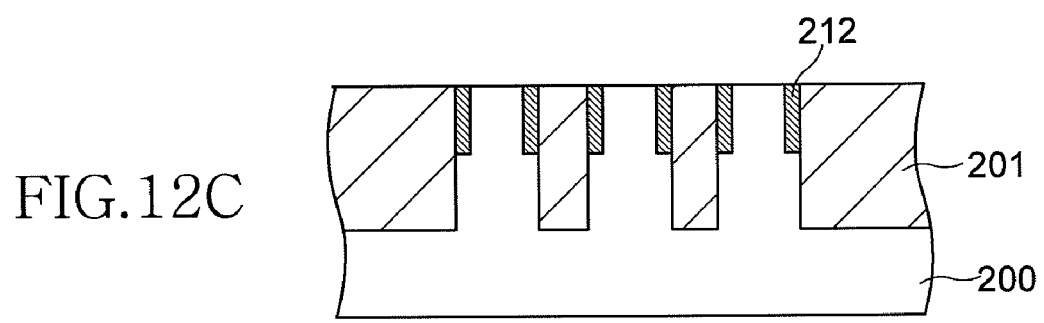
Figure 13A:
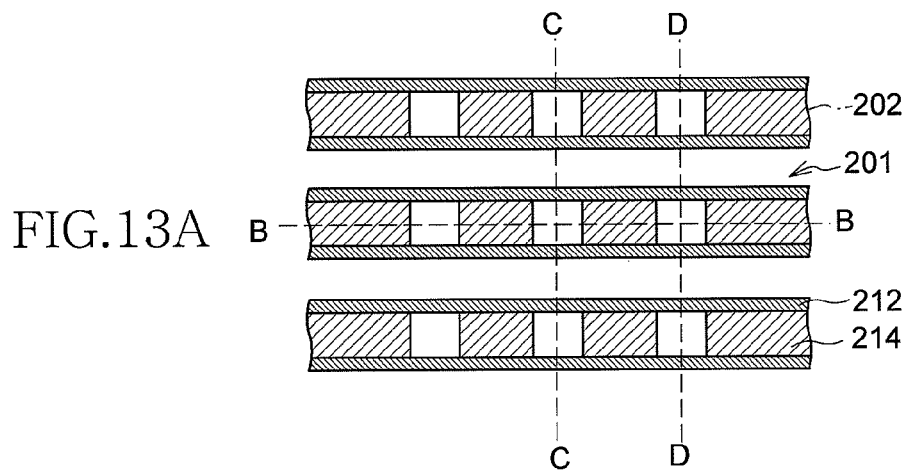
FIGS. 13A to 13D show one step (forming a first gate trench 203$gt_1$, a second gate trench 203$gt_2$, a dummy gate trench 203$dgt$ and fin portions 211) of manufacturing processes of the semiconductor device 20 according to the second embodiment.
Figure 13B:
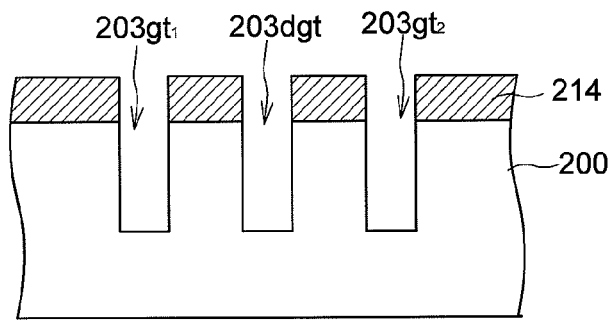
Figure 13C:
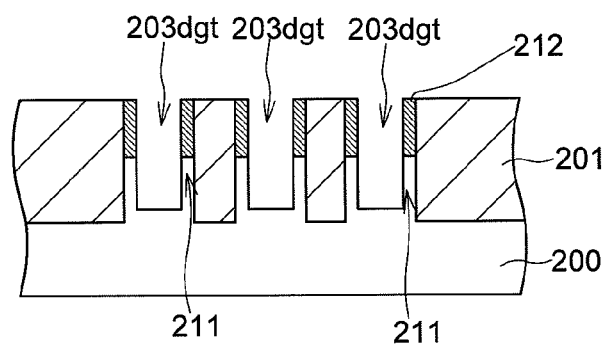
Figure 13D:
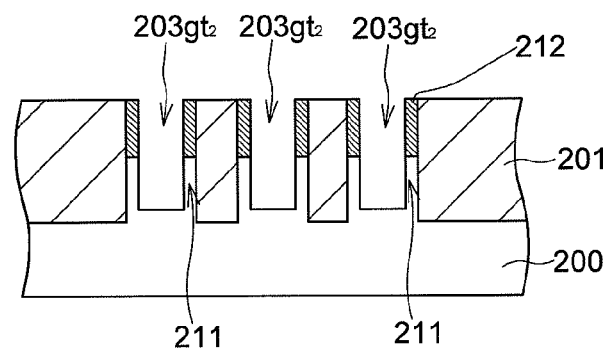
Figure 14A:
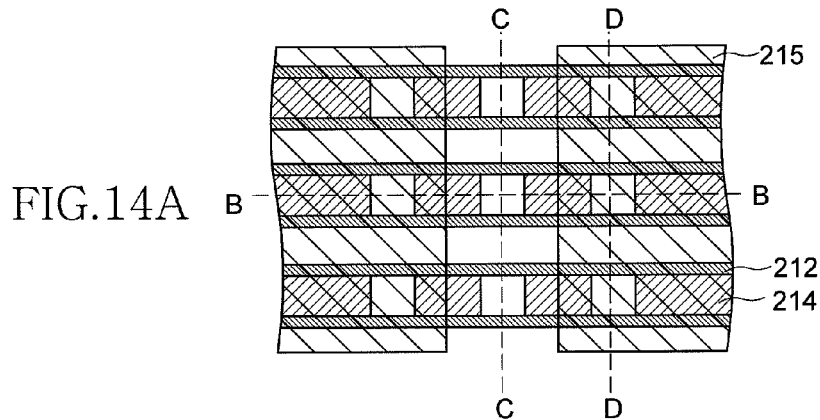
FIGS. 14A to 14D show one step (forming a photoresist 215) of manufacturing processes of the semiconductor device 20 according to the second embodiment.
Figure 14B:
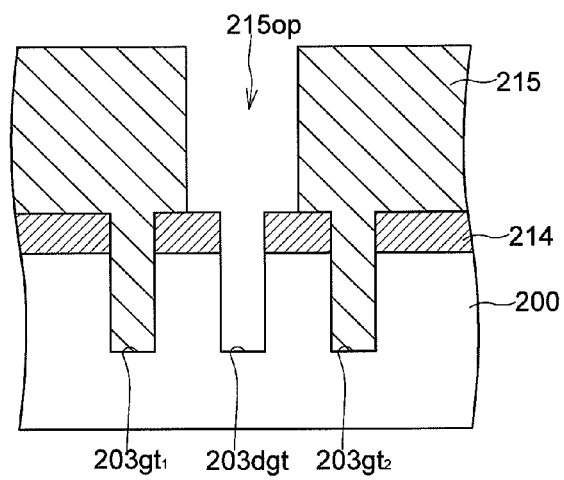
Figure 14C:
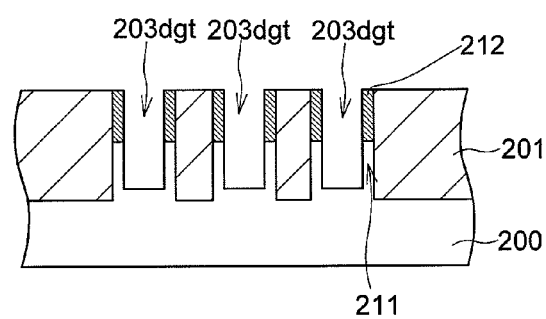
Figure 14D:
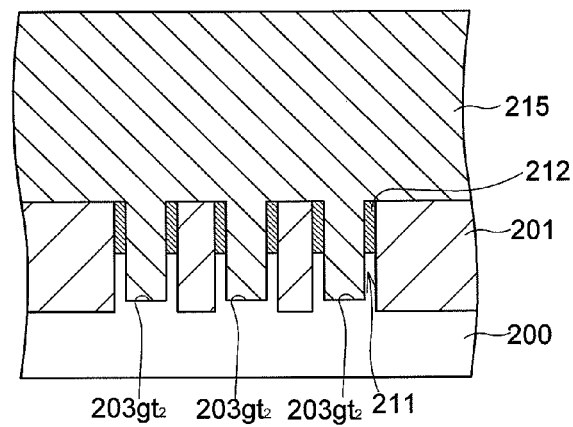
Figure 15A:
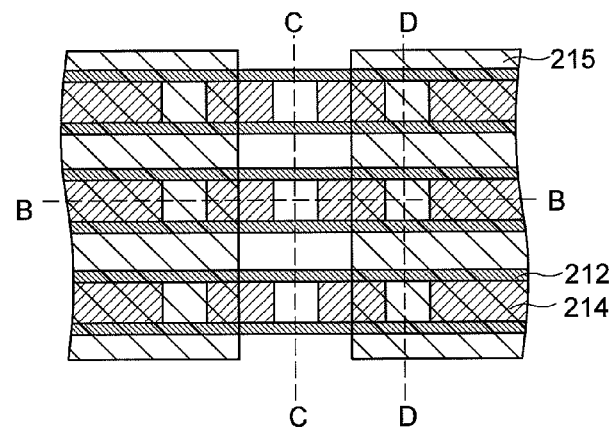
FIGS. 15A to 15D show one step (removing the fin portions 211 formed on the side of dummy gate trench 203$dgt$) of manufacturing processes of the semiconductor device 20 according to the second embodiment.
Figure 15B:
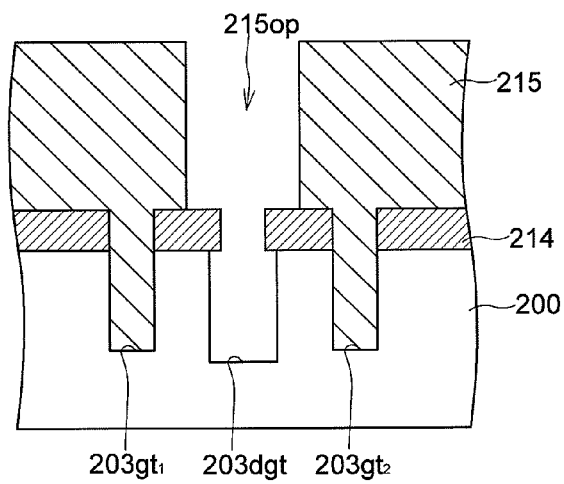
Figure 15C:
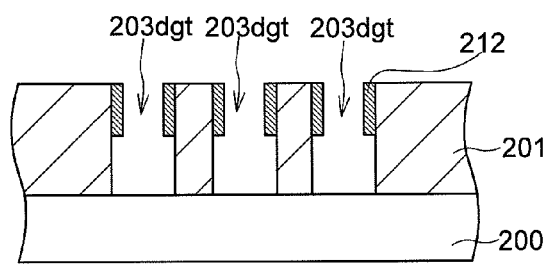
Figure 15D:
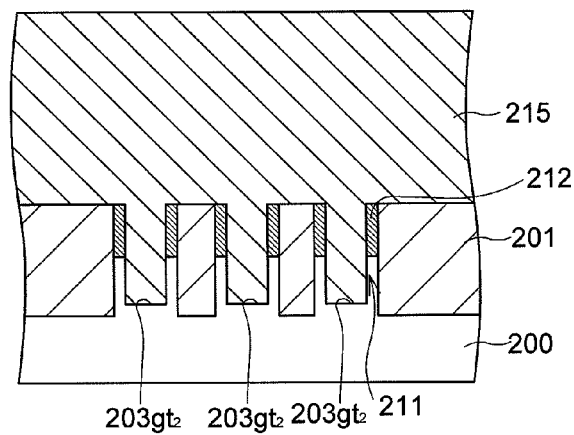
Figure 16A:
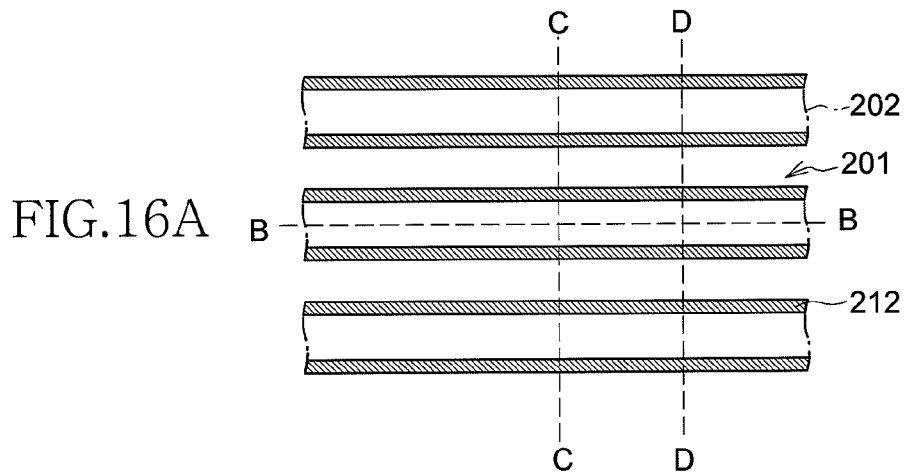
FIGS. 16A to 16D show one step (removing the photoresist 215 and the second mask layer 214) of manufacturing processes of the semiconductor device 20 according to the second embodiment.
Figure 16B:
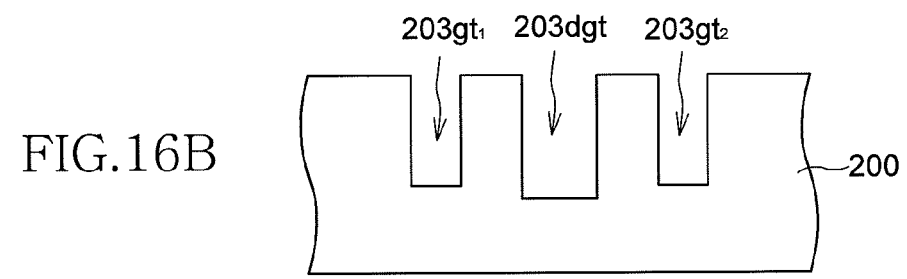
Figure 16C:
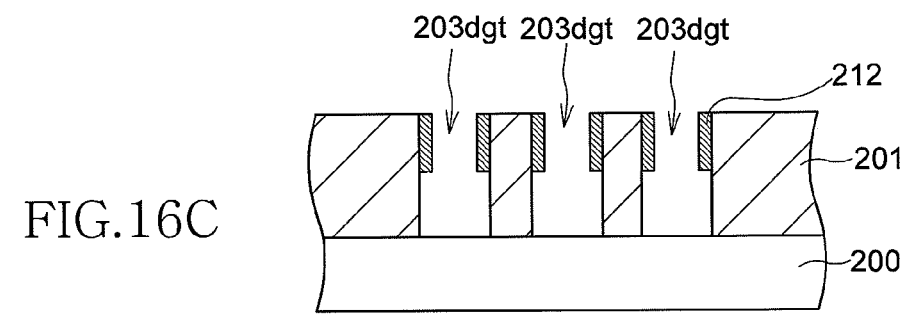
Figure 16D:
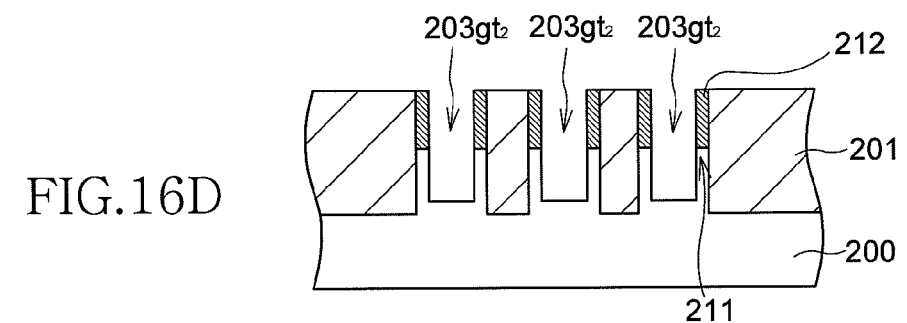

Thereafter, as shown in FIGS. 12 to 12C, planarization is performed until an upper surface of the semiconductor substrate 200 is exposed by CMP (Chemical Mechanical Polishing). As shown in FIGS. 13A to 13D, a second mask layer 214 exposing regions, where the first gate trenches $203gt_1$, the second gate trenches $203gt_2$, and the dummy gate trenches 203dgt are formed, is then formed. By using the second mask layer 214, the sidewall insulating films 212, and the STI regions 201 as a mask, the semiconductor substrate 200 is etched. The first gate trenches $203gt_1$, the second gate trenches $203gt_2$, and the dummy gate trenches 203dgt are thereby formed. At the same time, the fin portions 211 formed by a part of the semiconductor substrate 200 are formed in lower portions of the sidewall insulating films 212 on the side surfaces of the trenches $203gt_1$, $203gt_2$, and 203dgt, respectively.

As shown in FIGS. 14A to 14D, while the second mask layer 214 is left, a photoresist 215 including openings 215op exposing upper portions of the dummy gate trenches 203dgt is formed. As shown in FIGS. 15A to 15D, by using the photoresist 215 and the second mask layer 214 as a mask, the fin portions 211 formed on side surfaces of the dummy gate trenches 203dgt are removed by etching. At this time, the dummy gate trenches 203dgt slightly expand in the X direction (see FIGS. 7A to 7D) and a height direction.

As shown in FIGS. 16A to 16D, the photoresist 215 and the second mask layer 214 are removed. Thereafter, similarly to the first embodiment, the first gate electrodes $204g_1$, the second gate electrodes $204g_2$, the dummy gate electrodes 204dg, the first to fourth diffusion layers $105a_1$, $105a_2$, $105b_1$, and $105b_2$, the sidewall insulating films 107, and the contact plugs 108 at least a part of which are buried in the cap insulating films 106, the first gate trenches $203gt_1$, the second gate trenches $203gt_2$, and the dummy gate trenches 203dgt, respectively are sequentially formed, thereby obtaining the configuration shown in FIGS. 17A to 17D.

As described above, the second embodiment can exhibit effects identical to those of the first embodiment. Furthermore, the fin portions 211 are formed at least a part of the side surfaces of the first and second gate electrodes $204g_1$ and $204g_2$ in the X direction (lower side surfaces of the first and second gate electrodes $204g_1$ and $204g_2$) respectively. By this arrangement, while the first and second transistors 209 and 210 are turned on, each of the fin portions 211 serves as a channel region. It is, therefore, possible to reduce threshold voltages of the first and second transistors 209 and 210. Further, no fin portions are formed on the side surfaces of the dummy gate trenches 203dgt in the X direction (the fin portions are removed at the process shown in FIGS. 15A to 15D). It is, therefore, possible to set a threshold voltage of a transistor including each dummy gate electrode 204dg to be higher than those of the first and second transistors 209 and 210. It is, therefore, possible to ensure that each dummy gate electrode 204dg functions as an element isolation region between the first and second transistors 209 and 210.

A third embodiment of the present invention is described next. The third embodiment is a modification of the second embodiment and different from the second embodiment in a manufacturing process for not providing fin portions on side surfaces of dummy gate trenches. Due to this difference, there are some parts in configuration that are different from the second embodiment; however, the configurations of the second and third embodiments are functionally almost identical.

Figure 18A:
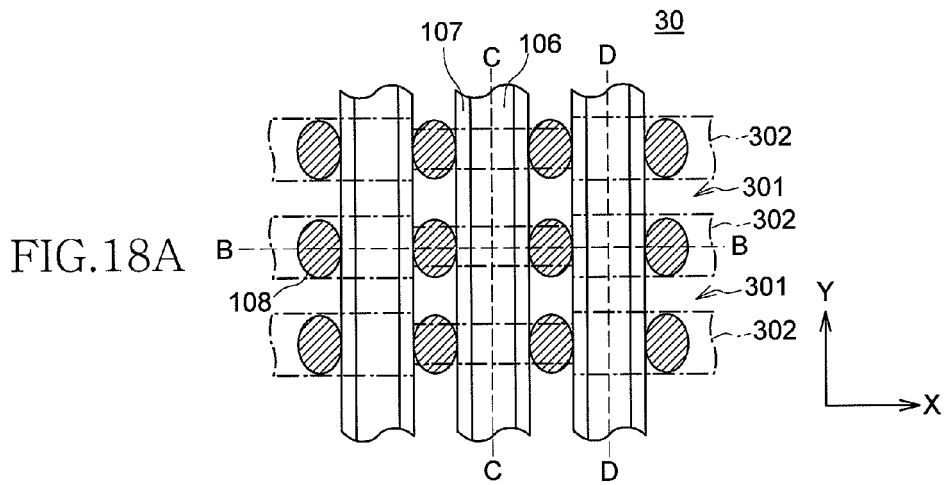
FIGS. 18A to 18D show a configuration of a semiconductor device 30 according to a third embodiment of the present invention, where
Figure 18B:
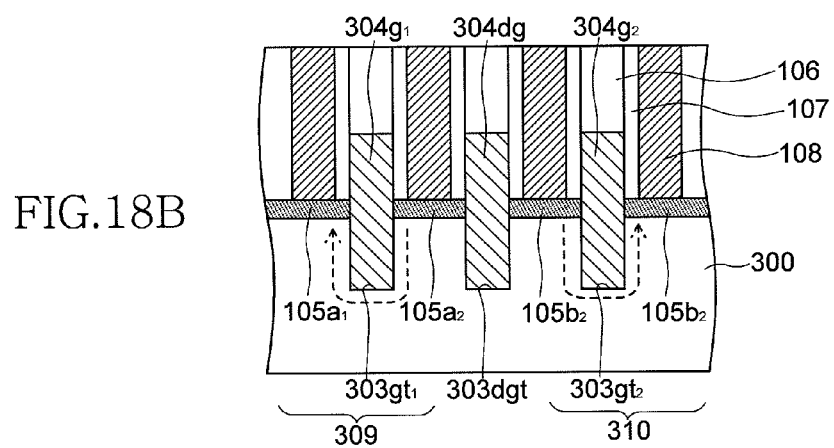
Figure 18C:
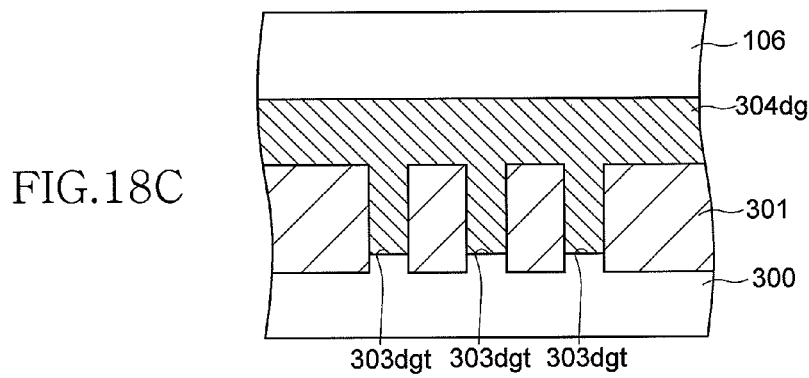
Figure 18D:
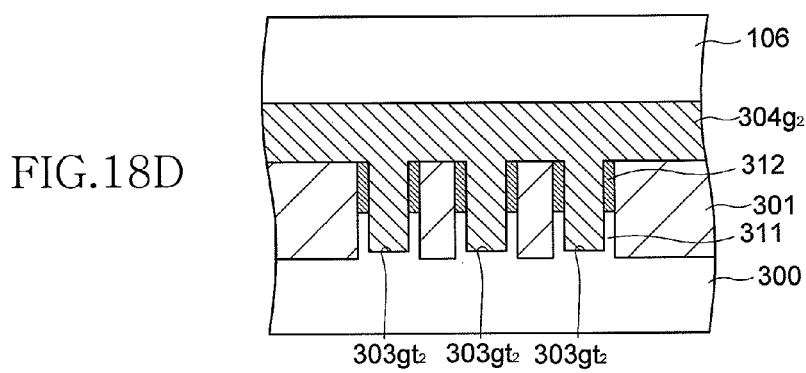
Figure 19A:
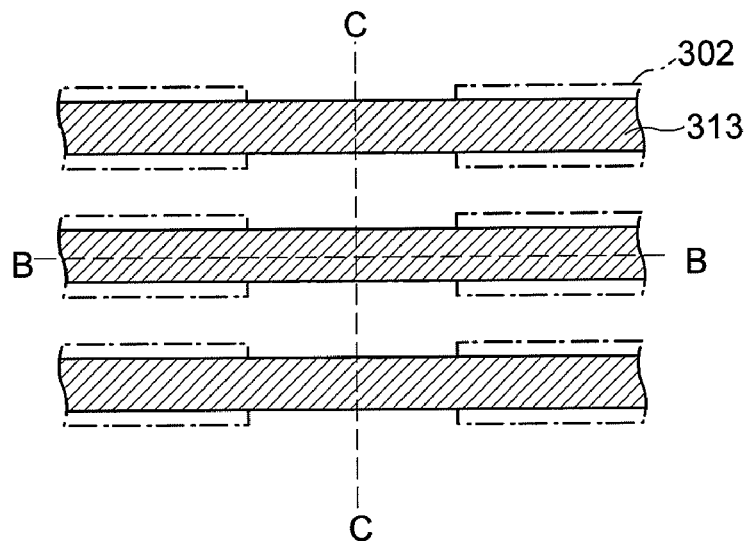
FIGS. 19A to 19C show one step (etching a first mask layer 313 and a semiconductor substrate 300) of manufacturing processes of the semiconductor device 30 according to the third embodiment.
Figure 19B:
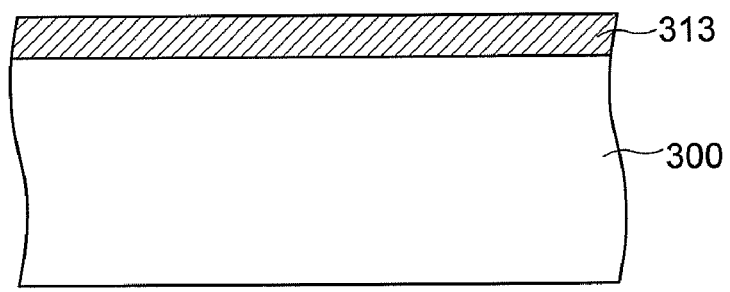
Figure 19C:
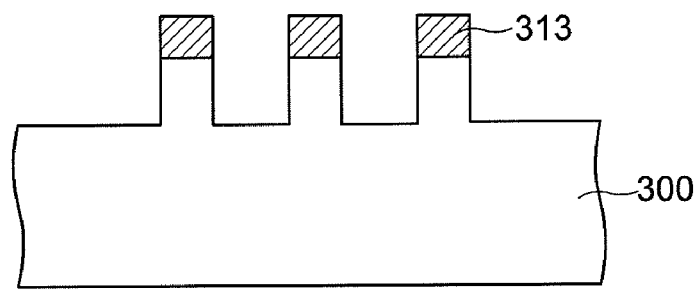
Figure 20A:
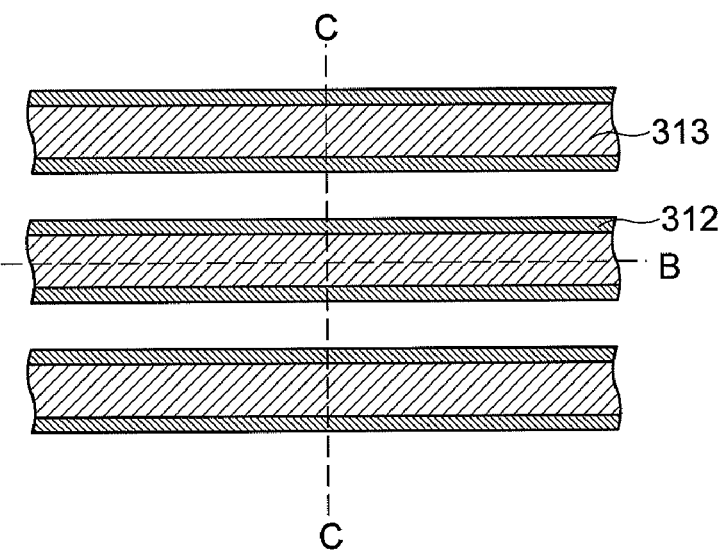
FIGS. 20A to 20C show one step (forming sidewall insulating films 312) of manufacturing processes of the semiconductor device 30 according to the third embodiment.
Figure 20B:
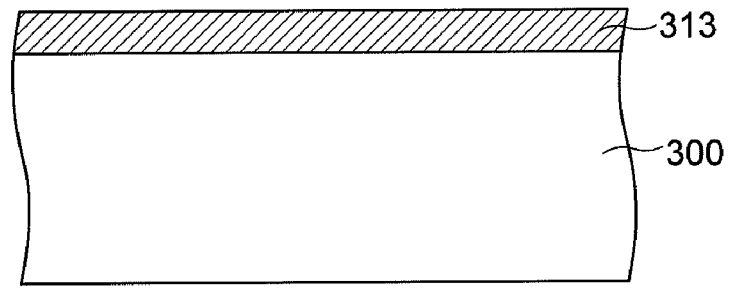
Figure 20C:
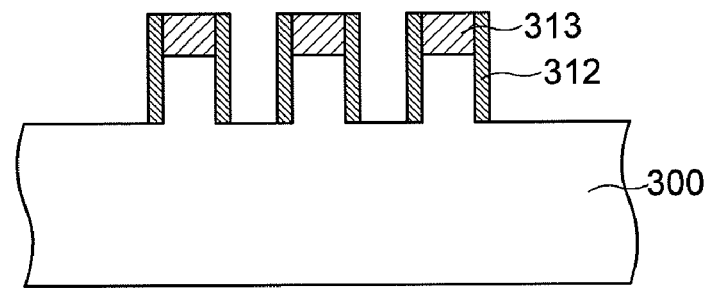
Figure 21A:
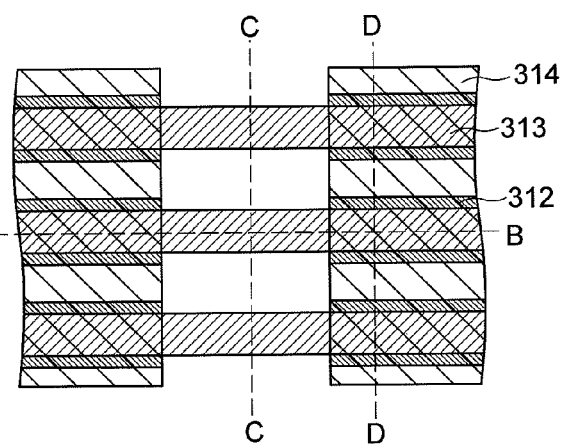
FIGS. 21A to 21D show one step (forming a photoresist 314) of manufacturing processes of the semiconductor device 30 according to the third embodiment.
Figure 21B:
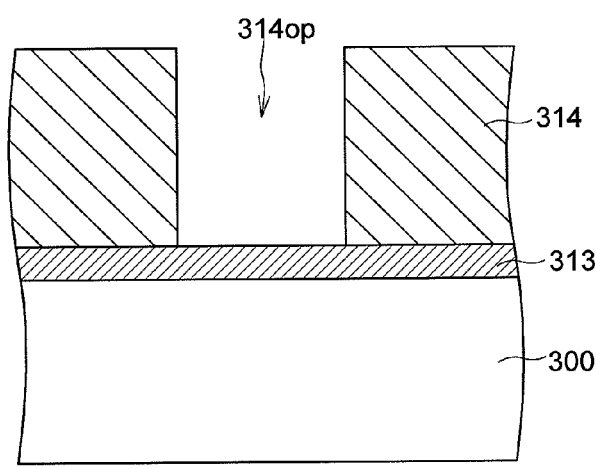
Figure 21C:
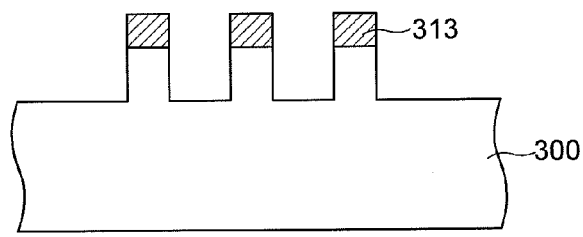
Figure 21D:
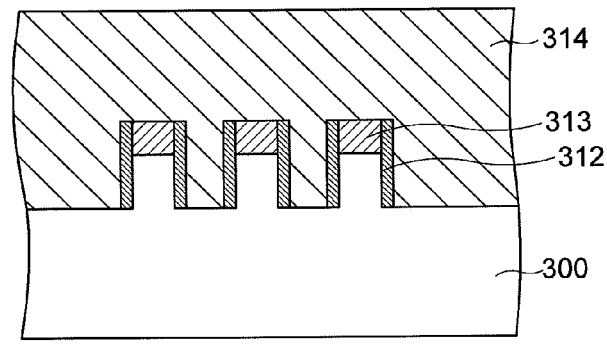

FIGS. 18A to 18D show a configuration of a semiconductor device 30 according to the third embodiment, where FIG. 18A is a schematic plan view, FIG. 18B is a schematic cross-sectional view taken along a line B-B of FIG. 18A, FIG. 18C is a schematic cross-sectional view taken along a line C-C of FIG. 18A, and FIG. 18D is a schematic cross-sectional view taken along a line D-D of FIG. 18A. In the third embodiment, constituent elements identical to those in the semiconductor device 10 according to the first embodiment are denoted by like reference numerals and explanations thereof will be omitted.

As shown in FIG. 18D, the semiconductor device 30 according to the third embodiment includes fin portions 311 provided in lower portions of side surfaces of first and second gate trenches $303gt_1$ and $303gt_2$ in an X direction, formed by a part of a semiconductor substrate 300, and constituting a part of channel regions, respectively. Sidewall insulating films 312 are provided on upper portions of the side surfaces of the first and second gate trenches $303gt_1$ and $303gt_2$ in the X direction, respectively. Therefore, upper portions of the first and second gate trenches $303gt_1$ and $303gt_2$ contact with STI regions 301 via the sidewall insulating films 312, respectively. In a first transistor 309 and a second transistor 310, channel regions formed when a predetermined bias is applied to each of first and second gate electrodes $304gt_1$ and $304gt_2$ are formed not only on side surfaces and bottom surfaces of the first and second gate trenches $303gt_1$ and $303gt_2$ in a Y direction but also on the fin portions 311 provided on the side surfaces thereof in the X direction. By this arrangement, it is possible to reduce threshold voltages of the first and second transistors 309 and 310. Meanwhile, as shown in FIG. 18C, no fin portions are formed on side surfaces of dummy gate trenches 303dgt in the X direction. The above configuration is identical to that of the semiconductor device 20 according to the second embodiment.

Differences between the second embodiment and the third embodiment are explained next. In the case of the semiconductor device 30 according to the third embodiment, the entire side surfaces of the dummy gate trenches 303dgt in the X direction contact with the STI regions 301 without via a part of the semiconductor substrate 300, as shown in FIG. 18C. That is, the sidewall insulating films 312 are not formed on upper surfaces of the side surfaces of the dummy gate trenches 303dgt in the X direction. By this configuration, as shown in FIG. 18A, active regions 302 defined and divided by the STI regions 301 are made narrower in the X direction near dummy gate electrodes 304dg. Further, a width of each dummy gate electrode 304dg in a height direction is identical from an upper portion to a lower portion thereof.

The third embodiment configurationally differs from the second embodiment as described above. However, the presence of the fin portions 311 enable the threshold voltage of the transistor including each dummy gate electrode 304dg to be set higher than those of the first and second transistors 309 and 310, and ensures that each dummy gate electrode 304dg functions as an element isolation region between the first and second transistors 309 and 310. These effects are common in the second embodiment and the third embodiment.

A manufacturing method of the semiconductor device 30 according to the third embodiment is described next.

FIGS. 18A to 18D to FIGS. 25A to 25D show manufacturing processes of the manufacturing method of the semiconductor device 30 according to the third embodiment. In FIGS. 18A to 18D to FIGS. 25A to 25D, each drawing tagged as "A" is a schematic plan view, each drawing tagged as "B" is a schematic cross-sectional view taken along a line B-B of "A", each drawing tagged as "C" is a schematic cross-sectional view taken along a line C-C of "A", and each drawing tagged as "D" is a schematic cross-sectional view taken along a line D-D of "A". When the schematic cross-sectional view taken along the line D-D is identical to that taken along the line C-C, the drawing tagged as "D" will be omitted.

First, as shown in FIGS. 19A to 19D, a first mask layer 313 having line-and-space patterns is formed on the semiconductor substrate 300. The region indicated by a one-dot chain line is to serve as the active region 302 later. In the third embodiment, the first mask layer 313 is formed so that a width of the first mask layer 313 is smaller than a largest width of the active region 302. By using the first mask layer 313 as a mask, the semiconductor substrate 300 is etched to form trenches.

As shown in FIGS. 21A to 21D, while the first mask layer 313 is left, a photoresist 314 including openings 314op exposing regions, where the dummy gate trenches 303dgt are formed, is formed. By using the photoresist 314 as a mask, the sidewall insulating films 312 are etched. Only the sidewall insulating films 312 formed in the regions, where the dummy gate trenches 303dgt are formed, are thereby removed.

Figure 22A:
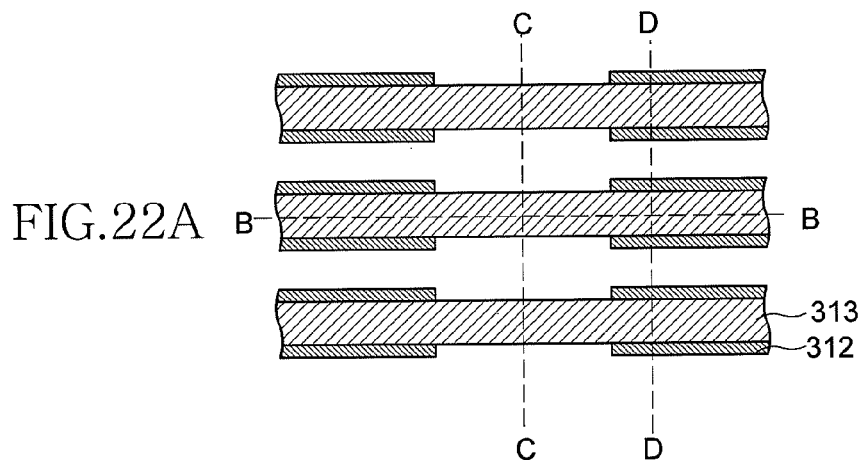
FIGS. 22A to 22D show one step (forming STI trenches 301$t$) of manufacturing processes of the semiconductor device 30 according to the third embodiment.
Figure 22B:
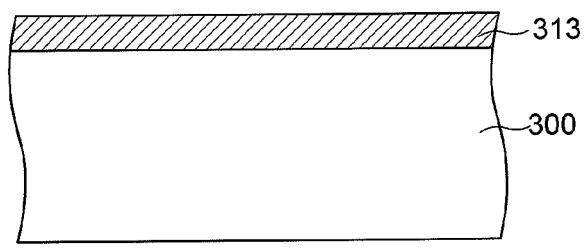
Figure 22C:
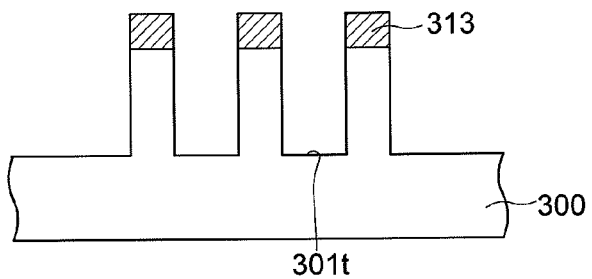
Figure 22D:
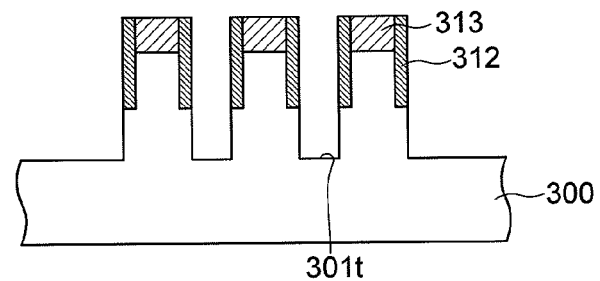

After removing the photoresist 314, by using the first mask layer 313 and the sidewall insulating film 312 as a mask, the semiconductor substrate 300 is etched to make the trenches deeper, thereby forming STI trenches 301t, as shown in FIGS. 22A to 22C.

Figure 23A:
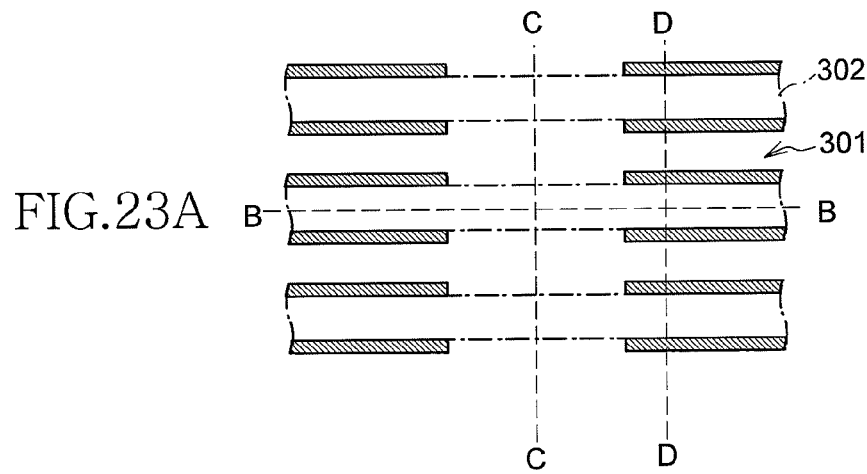
FIGS. 23A to 23D show one step (forming STI regions 301) of manufacturing processes of the semiconductor device 30 according to the third embodiment.
Figure 23B:
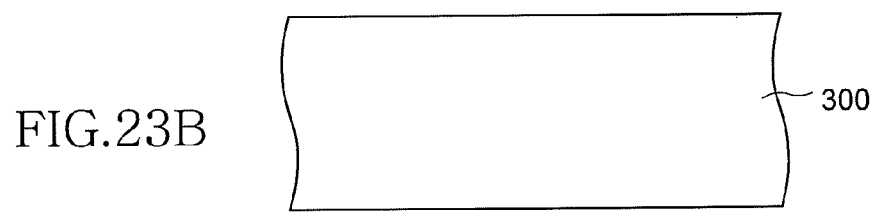
Figure 23C:
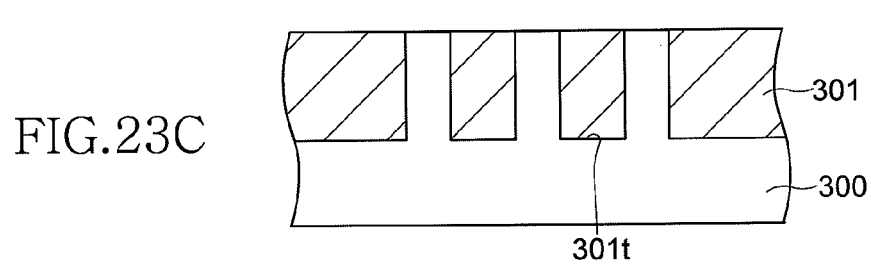
Figure 23D:
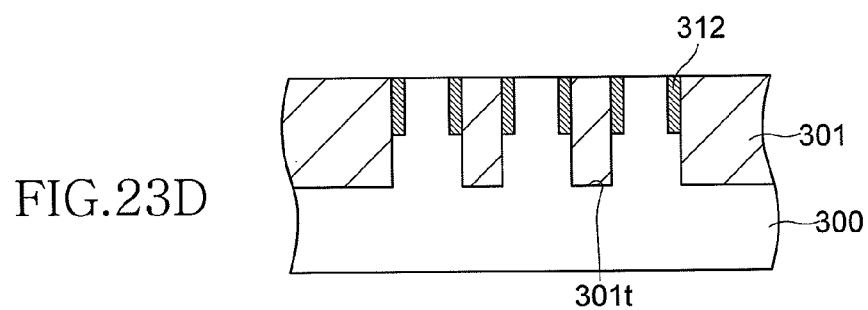
Figure 24A:
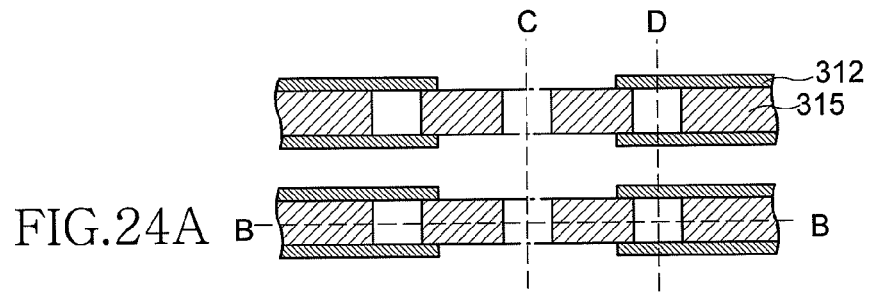
FIGS. 24A to 24D show one step (forming a second mask layer 315, a first gate trench 303$gt_1$, a second gate trench 303$gt_2$ and a dummy gate trench 303$dgt$) of manufacturing processes of the semiconductor device 30 according to the third embodiment.
Figure 24B:
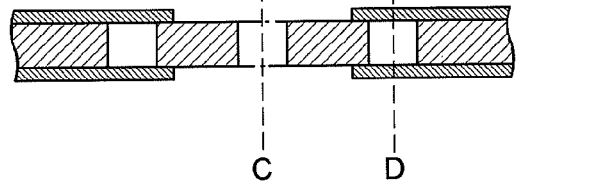
Figure 24C:
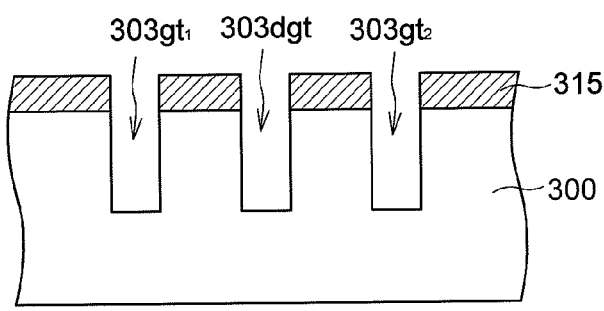
Figure 24D:
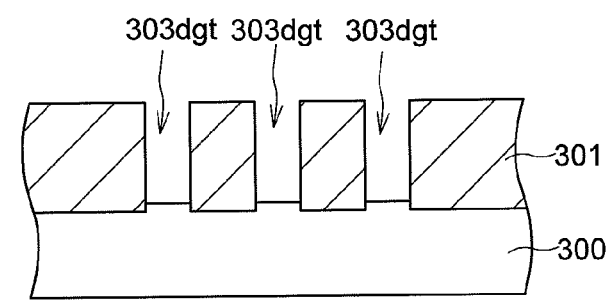
Figure 25A:
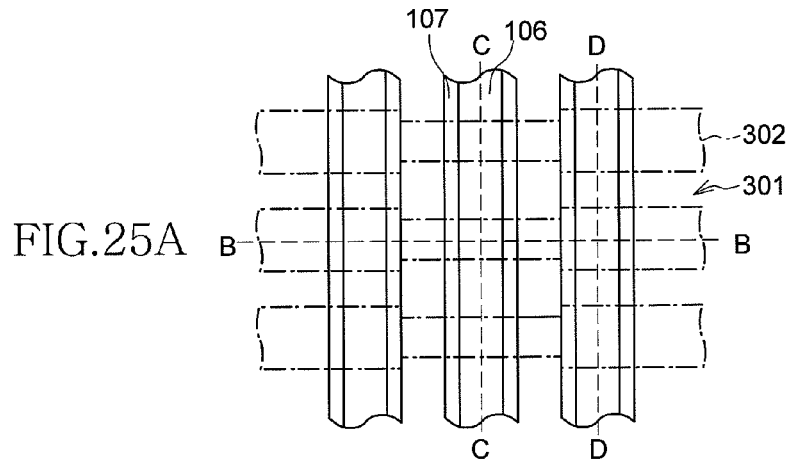
FIGS. 25A to 25D show one step (forming a first gate electrode 304$g_1$, a second gate electrode 304$g_2$ and a dummy gate electrode 304$dg$) of manufacturing processes of the semiconductor device 30 according to the third embodiment.
Figure 25B:
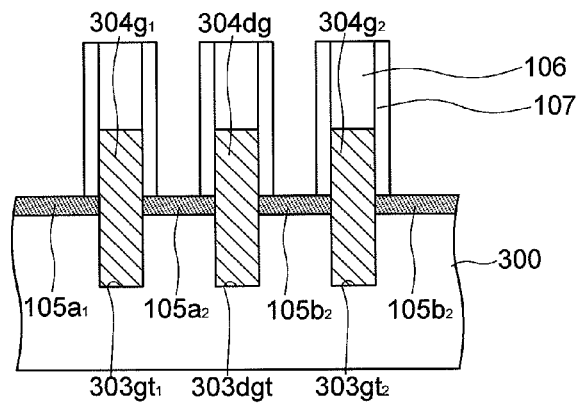
Figure 25C:
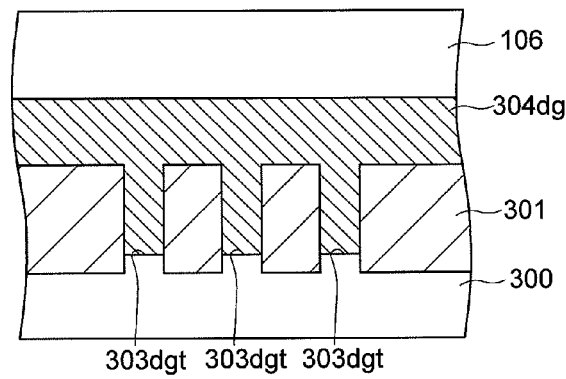
Figure 25D:
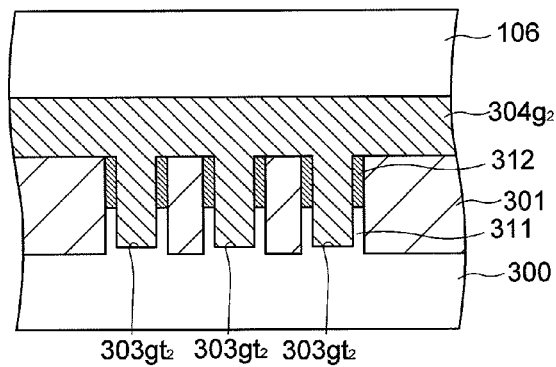
Figure 26A:
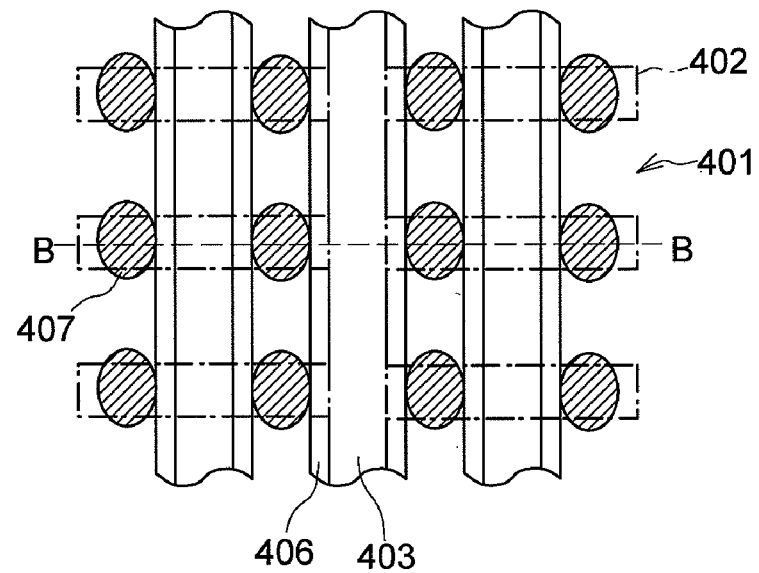
FIGS. 26A and 26B show a configuration of memory cell transistors of an ordinary DRAM, where
Figure 26B:
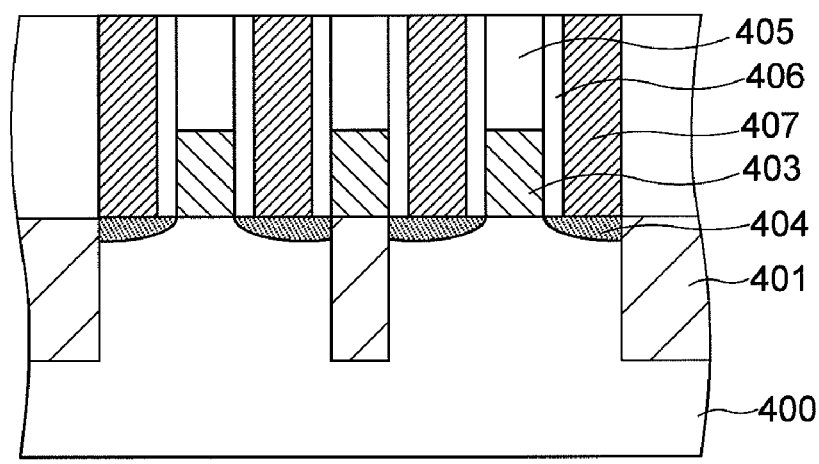
Figure 27A:
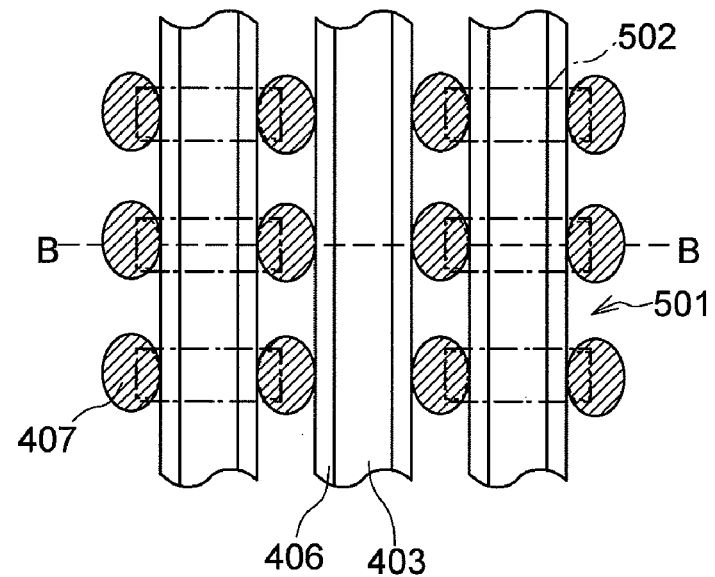
FIGS. 27A and 27B show a configuration of memory cell transistors when the distance between two adjacent active regions is narrower, where
Figure 27B:
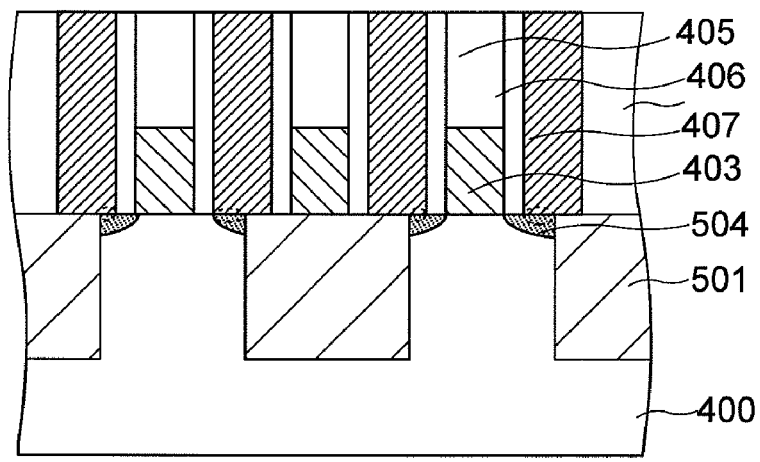

After removing the first mask layer 313, the STI trenches 301t are buried with an insulating film and subjected to planarization, thereby forming the STI regions 301, as shown in FIGS. 23A to 23C. In this way, the STI regions 301 define and divide the active regions 302.

As shown in FIGS. 24A to 24D, a second mask layer 315 exposing regions, where the first gate trenches $303gt_1$, the second gate trenches $303gt_2$, and the dummy gate trenches 303dgt are formed, is formed. By using the second mask layer 315, the sidewall insulating films 312, and the STI regions 301 as a mask, the semiconductor substrate 300 is etched. The first gate trenches $303gt_1$, the second gate trenches $303gt_2$, and the dummy gate trenches 303dgt are thereby formed. At the same time, the fin portions 311 formed by a part of the semiconductor substrate 300 are formed in lower portions of the sidewall insulating films 312 on the side surfaces of the first gate trenches $303gt_1$ and second gate trenches $303gt_2$, respectively.

Similarly to the first and second embodiments, the first gate electrodes $304gt_1$, the second gate electrodes $304g_2$, the dummy gate electrodes 304dg, first to fourth diffusion layers $105a_1$, $105a_2$, $105b_1$, and $105b_2$, sidewall insulating films 107, and contact plugs 108 at least a part of which are buried in cap insulating films 106, the first gate trenches $303gt_1$, the second gate trenches $303gt_2$, and the dummy gate trenches 303dgt, respectively are sequentially formed, thereby obtaining a configuration shown in FIGS. 25A to 25D.

As described above, according to the third embodiment, the semiconductor device 30 capable of achieving the same effects as those of the first and second embodiments can be formed by manufacturing processes different from those of the second embodiment.

It is apparent that the present invention is not limited to the above embodiments, but may be modified and changed without departing from the scope and spirit of the invention.

For example, in the above embodiments, each dummy gate electrode can be formed out of polycrystalline silicon having a conduction type (for example, P type) identical to that of the semiconductor substrate, and the first and second gate electrodes can be formed out of polycrystalline silicon having a different conduction type (for example, N type) from that of the semiconductor substrate. By this configuration, it is possible to further increase the threshold voltage of the transistor including each dummy gate electrode due to the difference in work function. To configure the semiconductor device as described in the alternative, an undoped polycrystalline silicon film is formed on an entire surface so as to be buried in the gate trenches and dummy trenches, and N impurity ions, for example, are then implanted into the polycrystalline silicon film on the gate trenches by using a mask layer that covers the dummy trenches. Next, another mask layer that covers the gate trenches is formed, P impurity ions, for example, are implanted into the polycrystalline silicon film on the dummy trenches, and the polycrystalline silicon film is then patterned into shapes of gate electrodes and dummy gate electrodes. By this arrangement, gate electrodes made of N+ polycrystalline silicon and dummy gate electrodes made of P+ polycrystalline silicon can be formed.

What is claimed is:

1. A semiconductor device comprising:
   an active region provided in a semiconductor substrate, defined by an STI region, and extending in a first direction;
   a first gate trench, a second gate trench, and a dummy gate trench formed in the active region;
   a first gate electrode, a second gate electrode, and a dummy gate electrode extending in a second direction crossing the first direction, at least a part of the first gate electrode, the second gate electrode, and the dummy gate electrode being buried in the first gate trench, the second gate trench, and the dummy gate trench, respectively;
   first and second diffusion layers formed in the active region provided on both sides of the first gate electrode, respectively; and
   third and fourth diffusion layers formed in the active region provided on both sides of the second gate electrode, respectively, wherein
   the first gate electrode and the first and second diffusion layers constitute a first transistor,
   the second gate electrode and the third and fourth diffusion layers constitute a second transistor, and
   the dummy gate electrode is arranged between the second diffusion layer and the third diffusion layer, and electrically isolates the first transistor from the second transistor.

2. The semiconductor device as claimed in claim 1, wherein
   the active region includes first and second fin shaped portions that work as channel regions of the first and second transistors, respectively, the first and second fin portions having side surfaces along the first direction,
   the first and second gate electrodes having side surfaces along the first direction buried in the first and second gate trenches, respectively,
   the side surfaces of the first fin shaped portion and the side surfaces of the first gate electrode are in contact with each other, and
   the side surfaces of the second fin shaped portion and the side surfaces of the second gate electrode are in contact with each other.

3. The semiconductor device as claimed in claim 2, further comprising sidewall insulating films formed in the first and second gate trenches, the sidewall insulating films being interposed between upper portions of the side surfaces of the first and second gate electrodes and the STI region.

4. The semiconductor device as claimed in claim 2, wherein side surfaces of the dummy gate trench in the first direction contacts with the STI region without intervention of a part of the semiconductor substrate.

5. The semiconductor device as claimed in claim 2, further comprising sidewall insulating films formed in the dummy gate trench, the sidewall insulating films being interposed between the dummy gate electrode and the STI region.

6. The semiconductor device as claimed in claim 1, wherein a transistor constituted by the dummy gate electrode and the second and third diffusion layers is always turned off.

7. A method of manufacturing a semiconductor device comprising:
   forming STI trenches in a semiconductor substrate to define an active region extending in a first direction in the semiconductor substrate;
   burying the STI trenches with an insulating film;
   forming a first gate trench, a second gate trench, and a dummy gate trench in the active region;
   forming a first gate electrode, a second gate electrode, and a dummy gate electrode extending in a second direction crossing the first direction so that at least a part of the first gate electrode, the second gate electrode, and the dummy gate electrode are buried in the first gate trench, the second gate trench, and the dummy gate trench, respectively; and
   forming first and second diffusion layers in the active region on both sides of the first gate electrode, respectively so as to form a first transistor constituted by the first gate electrode and the first and second diffusion layers, and forming third and fourth diffusion layers in the active region on both sides of the second gate electrode, respectively so as to form a second transistor constituted by the second gate electrode and the third and fourth diffusion layers, wherein
   the dummy gate electrode is arranged between the second diffusion layer and the third diffusion layer, and electrically isolates the first transistor from the second transistor.

8. The method of manufacturing a semiconductor device as claimed in claim 7, wherein forming the STI trenches includes:
   forming a first mask layer having line-and-space patterns on the semiconductor substrate extending in the first direction;
   forming first trench portions in the semiconductor substrate to constitute a part of the STI trenches by using the first mask layer;
   forming sidewall insulating films on inner side surfaces of the first trench portions at least in each of regions where the first and second gate trenches are formed; and
   forming second trench portions below the first trench portions in the semiconductor substrate to constitute at least remaining part of the STI trenches by using the first mask layer and the sidewall insulating film as a mask.

9. The method of manufacturing a semiconductor device as claimed in claim 8, wherein forming the gate trenches includes:
   forming a second mask layer exposing regions where the first gate trench, the second gate trench, and the dummy gate trench are formed, respectively; and
   forming fin shaped portions formed by a part of the semiconductor substrate below the sidewall insulating films by forming the first gate trench, the second gate trench, and the dummy gate trench in the semiconductor substrate by using the second mask layer and the sidewall insulating film as a mask.

10. The method of manufacturing a semiconductor device as claimed in claim 9, wherein forming the gate trenches further includes removing the fin shaped portions formed in the region where the dummy gate trench is formed.

11. The method of manufacturing a semiconductor device as claimed in claim 8, wherein the sidewall insulating films are formed on the inner side surface of the first trench portions also in the region where the dummy gate trench is formed, and the method further comprises removing the sidewall insulating films formed in the region where the dummy gate trench is formed, after forming the gate trenches and before forming the gate electrodes.

* * * * *